United States Patent
Brown et al.

(10) Patent No.: US 11,715,521 B2
(45) Date of Patent: *Aug. 1, 2023

(54) QUANTUM MEMORY SYSTEMS AND QUANTUM REPEATER SYSTEMS COMPRISING DOPED POLYCRYSTALLINE CERAMIC OPTICAL DEVICES AND METHODS OF MANUFACTURING THE SAME

(71) Applicant: CORNING INCORPORATED, Corning, NY (US)

(72) Inventors: Jason Allen Brown, Elmira, NY (US); Stuart Gray, Corning, NY (US); Thomas Dale Ketcham, Horseheads, NY (US); Daniel Aloysius Nolan, Corning, NY (US); Wageesha Senaratne, Horseheads, NY (US); Jun Yang, Horseheads, NY (US); Haitao Zhang, Ithaca, NY (US)

(73) Assignee: Corning Incorporated, Corning, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/741,591

(22) Filed: May 11, 2022

(65) Prior Publication Data
US 2022/0270684 A1 Aug. 25, 2022

Related U.S. Application Data

(60) Continuation of application No. 16/745,830, filed on Jan. 17, 2020, now Pat. No. 11,361,822, which is a
(Continued)

(51) Int. Cl.
*H04B 10/02* (2006.01)
*G11C 13/06* (2006.01)
(Continued)

(52) U.S. Cl.
CPC ............. *G11C 13/06* (2013.01); *H04B 10/29* (2013.01); *H04B 10/70* (2013.01); *G06N 10/00* (2019.01); *G11C 13/04* (2013.01)

(58) Field of Classification Search
CPC ....... H04B 10/70; H04B 10/29; H04L 9/0858; H04L 9/0852; H04L 9/0855;
(Continued)

(56) References Cited

U.S. PATENT DOCUMENTS

| 5,244,485 A | 9/1993 | Hihara et al. |
| 5,740,813 A | 4/1998 | Ogata et al. |

(Continued)

FOREIGN PATENT DOCUMENTS

| JP | 05-058674 A | 3/1993 |
| JP | 2009-081322 A | 4/2009 |

(Continued)

OTHER PUBLICATIONS

"Comparison of Industrial Coating to Improve Performance & Extend Service Life"; Industrial Coatings Comparision for Wear, Corrosion, Release, Lubrication & Friction; Downloaded Jun. 20, 2016; 8 Pages.
(Continued)

*Primary Examiner* — Hanh Phan
(74) *Attorney, Agent, or Firm* — Svetlana Z. Short

(57) ABSTRACT

A method of manufacturing a doped polycrystalline ceramic optical device includes mixing a plurality of transition metal complexes and a plurality of rare-earth metal complexes to form a metal salt solution, heating the metal salt solution to form a heated metal salt solution, mixing the heated metal salt solution and an organic precursor to induce a chemical reaction between the heated metal salt solution and the organic precursor to produce a plurality of rare-earth doped crystalline nanoparticles, and sintering the plurality of rare-
(Continued)

earth doped nanoparticles to form a doped polycrystalline ceramic optical device having a rare-earth element dopant that is uniformly distributed within a crystal lattice of the doped polycrystalline ceramic optical device.

12 Claims, 6 Drawing Sheets

Related U.S. Application Data division of application No. 15/906,631, filed on Feb. 27, 2018, now Pat. No. 10,553,280.

(60) Provisional application No. 62/465,372, filed on Mar. 1, 2017.

(51) Int. Cl.
  H04B 10/29 (2013.01)
  H04B 10/70 (2013.01)
  G11C 13/04 (2006.01)
  G06N 10/00 (2022.01)

(58) Field of Classification Search
  CPC ..... C04B 35/486; C04B 35/505; B82Y 10/00; G06N 99/002; G11C 13/06; G11C 13/04; G11C 13/048; G11C 13/0004
  USPC ....... 398/173, 175, 177, 180, 181, 178, 179, 398/37, 158, 159, 79, 141, 140; 380/255, 380/256, 270, 278, 279, 283; 365/114, 365/106
  See application file for complete search history.

(56) References Cited

U.S. PATENT DOCUMENTS

| | | | |
|---|---|---|---|
| 5,748,013 A | 5/1998 | Beauclair et al. | |
| 6,650,670 B1 * | 11/2003 | Shimoji | H01S 3/16 372/39 |
| 8,135,276 B2 | 3/2012 | Munro et al. | |
| 8,190,553 B2 | 5/2012 | Routt | |
| 8,781,334 B2 | 7/2014 | Munro et al. | |
| 9,313,180 B1 | 4/2016 | Gray et al. | |
| 9,580,650 B1 | 2/2017 | Cao et al. | |
| 9,659,651 B1 | 5/2017 | Aitken et al. | |
| 10,304,536 B2 | 5/2019 | Brown et al. | |
| 10,553,280 B2 * | 2/2020 | Brown | H04B 10/70 |
| 11,361,822 B2 * | 6/2022 | Brown | H04B 10/29 |
| 2005/0190637 A1 | 9/2005 | Ichimura et al. | |
| 2006/0163465 A1 | 7/2006 | Kuzmich et al. | |
| 2008/0089696 A1 | 4/2008 | Furuta | |
| 2011/0104491 A1 | 5/2011 | Shaw et al. | |
| 2011/0222387 A1 | 9/2011 | Ham | |
| 2012/0170091 A1 | 7/2012 | Goto et al. | |
| 2013/0107617 A1 | 5/2013 | Skold et al. | |
| 2015/0029581 A1 * | 1/2015 | Fan | H01S 3/1616 359/341.31 |
| 2018/0002217 A1 | 1/2018 | Boughton et al. | |

FOREIGN PATENT DOCUMENTS

| | | |
|---|---|---|
| KR | 10-2010-0016999 A | 2/2010 |
| RU | 2062540 C1 | 6/1996 |
| TW | I481066 B | 4/2015 |
| WO | 2011/036814 A1 | 3/2011 |
| WO | 2011/073656 A1 | 6/2011 |
| WO | 2015/186656 A1 | 12/2015 |

OTHER PUBLICATIONS

Afzelius et al; "Multimode Quantum Memory Based on Atomic Frequency Combs"; Phys. Rev. 79, (2009) pp. 1-10.

Beaudoux et al; "Emission of Photon Echoes in a Strongly Scattering Medium"; Optics Express; vol. 19, No. 16; Aug. 1, 2011; pp. 15236-15243.

Chandra et al., "Synthesis, Morphology, and Optical Characterization of Nanocrystalline Er 3+ :Y 2 0 3", Journal of Physical Chemistry C, vol. 114, No. 2, Jan. 21, 2010, pp. 874-880.

Chen et al; "Upconversion Emission Enhancement in Yb3+/Er3+-Codoped Y2O3 Nanocrystals by Tridoping With Li+ Ions"; J. Phys. Chem. C.; 2008; 112; pp. 12030-12036.

Clausen et al; "Quantum Storage of Photonic Entanglement in a Crystal"; Nature; 469, (2011); pp. 508-511.

Dictionary of Science and Technology; Barnes & Nobel Publishers; Definition of Friction, founded 1873, pp. 488-489.

Elert Glenn., "Coefficients of Friction for Teflon", The Physics Factbook, 2004, 3 Pages.

Gruber et al; "Modeling Optical Transitions of Er3+(4f11) in C2 and C3/ Sites in Polycrystalline Y2O3"; Journal of Applied Physics, 104, 023101 (2008); pp. 023101-1-023101-9.

Gruber et al; "Spectral Analysis of Synthesized Nanocrystalline Aggregates of ER3+: Y2O3"; Journal of Applied Physics, 101, 113116 (2007); pp. 113116-1-113116-6.

Hastings-Simon et al; "Controlled Stark Shifts in Er3+-Doped Crystalline and Amorphous Waveguides for Quantum State Storage"; Optics Communications; 266 (2006); pp. 716-719.

Heinze et al: "Stopped Light and Image Storage by Electromagnetically Induced Transparency up to the Regime of One Minute", Jul. 1, 2013 (Jul. 1, 2013).

Jobez et al; "Coherent Spin Control at the Quantum Level in an Ensemble-Based Optical Memory"; Physical Review Letters; 114; 230502; Jun. 12, 2015; pp. 230502-1-230502-5.

Louchet et al: "Branching Ratio Measurement of a "Lambda" System in Tm3+:YAG under magnetic field", Jun. 6, 2006 (Jun. 6, 2006).

Louchet et al: "Optical Excitation of Nuclear Spin Coherence in Tm3+:YAG", Oct. 17, 2007 (Oct. 17, 2007).

Marino et al., "Energy Level Structure and Optical Dephasing under Magnetic Field in Er3+:LiYF4 at 1.5[mu]m", vol. 169,Mar. 14, 2015, pp. 478-482.

McMaster-Carr; "Super-Cushioning Polyurethan Foam Sheets, Bars, Cubes, and Strips"; Sheets With Smooth Texture; Downloaded May 14, 2018; 2 Pages.

Miyoshi, Kazuhisa; "Solid Lubricants and Coatings for Extreme Environments: State-of-the-Art Survey"; NASA/TM-2007-214668; Jan. 2007, 21 Pages.

Nilsson et al; "Solid State Quantum Memory Using Complete Absorption and Re-Emission of Photons by Tailored and Externally Controlled Inhomogeneous Absorption Profiles"; Optics Communications; 247; (2005) pp. 393-403.

Perrot et al; "Narrow Optical Homegenous Linewidths in Rare Earth Doped Nanocrystals"; Physical Review Letters; 111; 203601; Nov. 15, 2013; pp. 203601-1-203601-5.

Saglamyurek et al., "Broadband Waveguide Quantum Memory For Entangled Photons," Nature, vol. 469, Jan. 27, 2011, pp. 512-515.

Saglamyurek et al., "Quantum Storage Of Entangled Telecom-Wavelength Photons In An Erbium-Doped Optical Fibre," Nature Photonics vol. 9, Jan. 2015, 10 pages.

Sangouard et al; "Quantum Repeaters Based on Atomic Ensembles and Linear Optics"; Rev. Mod. Phys. 83, 33, Mar. 21, 2011; pp. 1-52.

Thiel et al; "Rare-Earth-Doped Materials for Applications in Quantum Information Storage and Signal Processing"; Journal of Luminescence, 131 (2011) pp. 353-361.

Usmani et al., "Heralded quantum entanglement between two crystals", Nature Photonics, vol. 6, No. 4, Mar. 1, 2012, pp. 234-237.

Zhou et al; "Quantum Storage of Three-Dimensional Orbital-Angular-Momentum Entanglement in a Crystal"; Physical Review Letters; 115; 070502; Aug. 14, 2015; pp. 070502-1-070502-6.

* cited by examiner

QUANTUM MEMORY SYSTEMS AND QUANTUM REPEATER SYSTEMS COMPRISING DOPED POLYCRYSTALLINE CERAMIC OPTICAL DEVICES AND METHODS OF MANUFACTURING THE SAME

CROSS REFERENCE TO RELATED APPLICATIONS

This application is a continuation of U.S. application of Ser. No. 16/745,830 filed on Jan. 17, 2020, which is a divisional application and claims the benefit of priority under 35 U.S.C. § 120 of U.S. application Ser. No. 15/906,631 filed on Feb. 27, 2018, which issued on Feb. 4, 2020 as U.S. Pat. No. 10,553,280, which in turn, claims the benefit of and priority to U.S. Provisional Application No. 62/465,372, filed Mar. 1, 2017, the contents of each which are relied upon and incorporated herein by reference in their entireties.

BACKGROUND

The present disclosure relates to quantum memory systems and quantum repeater systems. More specifically, the present disclosure introduces technology for quantum memory systems and quantum repeater systems having a doped polycrystalline ceramic optical device.

BRIEF SUMMARY

According to the subject matter of the present disclosure, a method of manufacturing a doped polycrystalline ceramic optical device includes mixing a plurality of transition metal complexes and a plurality of rare-earth metal complexes to form a metal salt solution, heating the metal salt solution to form a heated metal salt solution, mixing the heated metal salt solution and an organic precursor to induce a chemical reaction between the heated metal salt solution and the organic precursor to produce a plurality of rare-earth doped crystalline nanoparticles, and sintering the plurality of rare-earth doped nanoparticles to form a doped polycrystalline ceramic optical device having a rare-earth element dopant that is uniformly distributed within a crystal lattice of the doped polycrystalline ceramic optical device.

In accordance with one embodiment of the present disclosure, a quantum memory system includes a doped polycrystalline ceramic optical device, a magnetic field generation unit, and one or more pump lasers. The doped polycrystalline ceramic optical device is positioned within a magnetic field of the magnetic field generation unit when the magnetic field generation unit generates the magnetic field. The one or more pump lasers are optically coupled to the doped polycrystalline ceramic optical device. Further, the doped polycrystalline ceramic optical device is doped with a rare-earth element dopant that is uniformly distributed within a crystal lattice of the doped polycrystalline ceramic optical device and configured such that a plurality of storage photons traversing the doped polycrystalline ceramic optical device attenuate at an attenuation rate of about 3 dB/mm or less.

In accordance with another one embodiment of the present disclosure, an optical system includes a quantum repeater system, one or more magnetic field generation units, and one or more pump lasers. The quantum repeater system includes two doped polycrystalline ceramic optical devices and repeater entanglement optics. Each doped polycrystalline ceramic optical device of the quantum repeater system is positioned within a magnetic field of the one or more magnetic field generation units when the one or more magnetic field generation units generate the magnetic field. Each doped polycrystalline ceramic optical device of the quantum repeater system is doped with a rare-earth element dopant that is uniformly distributed within a crystal lattice of the doped polycrystalline ceramic optical device and configured such that a plurality of storage photons traversing the doped polycrystalline ceramic optical device attenuate at an attenuation rate of about 3 dB/mm or less. Further, at least one of the one or more pump lasers are optically coupled to each doped polycrystalline ceramic optical device of the quantum repeater system. Moreover, the repeater entanglement optics includes two entangling pathways optically coupled to each doped polycrystalline ceramic optical device and a beamsplitter positioned such that each entangling pathway traverses the beamsplitter.

Although the concepts of the present disclosure are described herein with primary reference to some specific quantum memory systems, it is contemplated that the concepts will enjoy applicability to quantum memory systems and quantum repeater systems having any configuration.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1:
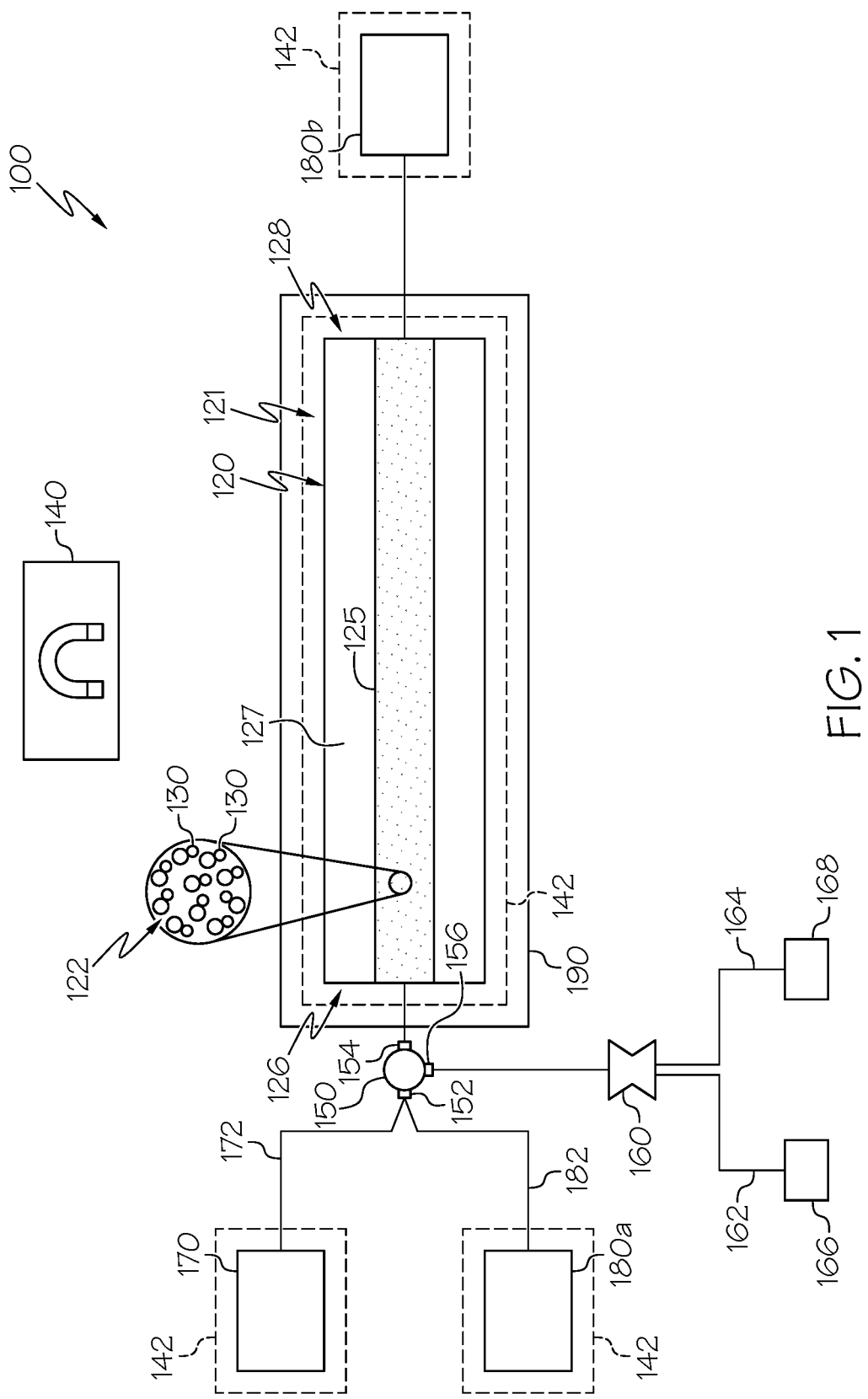
FIG. 1 is a schematic illustration of a quantum memory system having a doped polycrystalline ceramic optical device with a rare-earth element dopant, according to one or more embodiments shown and described herein.
Figure 4:
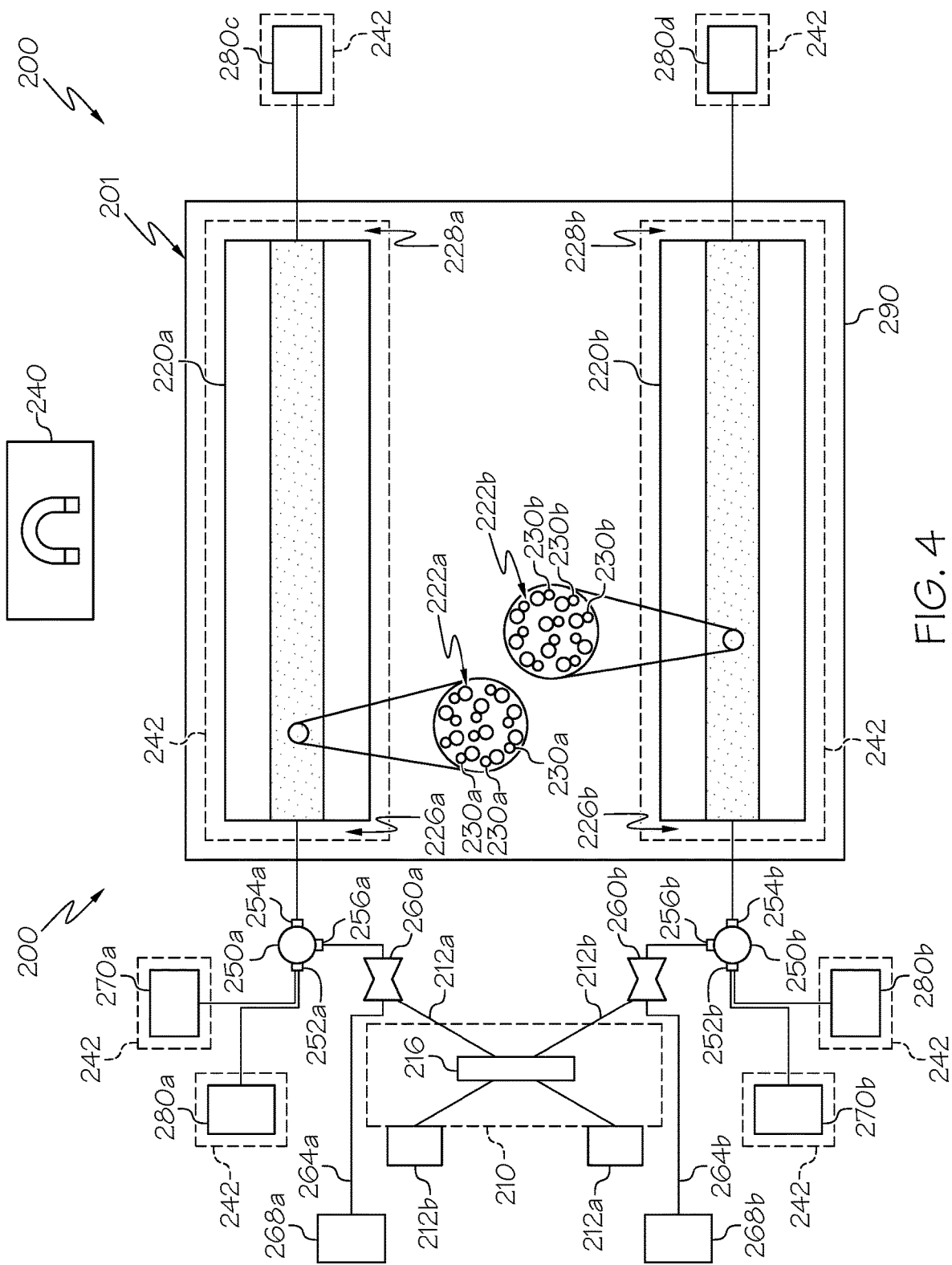
FIG. 4 is a schematic illustration of an optical system having multiple doped polycrystalline ceramic optical devices with a rare-earth element dopant as depicted in FIG. 1, arranged in a quantum repeater system, according to one or more embodiments shown and described herein.

FIG. 1 is a schematic illustration of quantum memory system 100. The quantum memory system 100 comprises a doped polycrystalline ceramic optical device 120, a magnetic field generation unit 140, a storage photon generator 170, and one or more pump lasers 180, for example a first pump laser 180a and a second pump laser 180b. As described below, the quantum memory system 100 is structurally configured to store and release one or more storage photons, for example, on demand, such that the quantum memory system 100 may be synchronized with one or more additional quantum memory systems to form a quantum repeater system 201, for example, as depicted in FIG. 4. Further, the components of the quantum memory system 100, for example, the doped polycrystalline ceramic optical device 120 may be positioned in an optical system 200 that includes one or more quantum repeater systems 201 each comprising a pair of doped polycrystalline ceramic optical devices 120, as depicted in FIG. 4. The optical system 200 including the one or more quantum repeater systems 201 may be structurally configured to entangle a pair of storage photons that are each stored and released by the doped polycrystalline ceramic optical devices 120 of the respective quantum memory systems. Moreover, the quantum memory system 100 and the optical system 200 described herein may be incorporated into one or more quantum communications systems, for example, quantum key generation systems, quantum telecommunications systems, quantum internet systems, and any other current or yet-to be developed quantum communications systems.

As depicted in FIG. 1, the doped polycrystalline ceramic optical device 120 of the quantum memory system 100 includes a crystal lattice 122 and is doped with a rare-earth element dopant 130 that is uniformly distributed within the crystal lattice 122 of the doped polycrystalline ceramic optical device 120.

As used herein, "uniform distribution" refers to a distribution of a dopant within a crystal lattice, such as the rare-earth element dopant 130, in which at least 50% (and preferably 75% or more) of the dopant is doped into grains of the crystal lattice at locations apart from the grain boundaries of the crystal lattice.

The doped polycrystalline ceramic optical device 120 comprises a first end 126 and a second end 128, which may be opposite the first end 126. The doped polycrystalline ceramic optical device 120 may comprise a metal oxide formed into a polycrystalline ceramic, such as yttrium oxide, zirconium oxide, hafnium oxide or the like. For example, the doped polycrystalline ceramic optical device 120 may comprise a combination of yttrium oxide and zirconium oxide. As another example, the doped polycrystalline ceramic optical device 120 may comprise a combination of zirconium oxide and hafnium oxide where hafnium oxide comprises about 2-10% of a total molecular weight of the doped polycrystalline ceramic optical device 120, for example, 4%, 6%, 8%, or the like. Further, the doped polycrystalline ceramic optical device 120 may be transparent.

As depicted in FIG. 1 the doped polycrystalline ceramic optical device 120 may comprise a doped polycrystalline ceramic optical waveguide 121 having a polycrystalline ceramic core 125 and a cladding 127 surrounding the polycrystalline ceramic core 125. The cladding 127 comprises a refractive index that is lower than a refractive index of the polycrystalline ceramic core 125 such that photons traversing the polycrystalline ceramic core 125 undergo total internal reflection at the core-cladding boundary between polycrystalline ceramic core 125 and the cladding 127. When the difference between the refractive indices of the polycrystalline ceramic core 125 and the cladding 127 is small, a larger polycrystalline ceramic core 125 (relative to the cladding 127) may be desired and when there the difference between the refractive indices of the polycrystalline ceramic core 125 and the cladding 127 is large, a smaller polycrystalline ceramic core 125 (relative to the cladding 127) may be desired.

Further, the polycrystalline ceramic core 125 may comprise a metal oxide, for example, yttrium oxide and/or zirconium oxide formed into a polycrystalline ceramic. Further, the cladding 127 may comprise a polymer, for example, a UV durable polymer, a polymer in an organic matrix, or any other known or yet to be developed polymer suitable as a cladding. As one example, the polycrystalline ceramic core 125 comprises yttrium oxide and the cladding 127 comprises a polymer. Alternatively, the cladding 127 may comprise a polycrystalline ceramic for example, a metal oxide, for example, yttrium oxide and/or zirconium oxide formed into a polycrystalline ceramic. As one example, the polycrystalline ceramic core 125 may comprise a combination of yttrium oxide, and zirconium oxide and the cladding 127 may comprise yttrium oxide. Moreover, the polycrystalline ceramic core 125 of the doped polycrystalline ceramic optical waveguide 121 is doped with a rare-earth element dopant 130 that is uniformly distributed within a crystal lattice 122 of the polycrystalline ceramic core 125. Further, while the doped polycrystalline ceramic optical device 120 is depicted as the doped polycrystalline ceramic optical waveguide 121 in FIG. 1, it should be understood that the doped polycrystalline ceramic optical device 120 may comprise any optical device, for example, optical devices that do not include a core and a cladding.

Further, the doped polycrystalline ceramic optical device 120 may comprise a variety of shapes and sizes to facilitate photon absorption and release. For example, the doped polycrystalline ceramic optical device 120 may comprise a length extending between the first end 126 and the second end 128 that is between about 1 cm and about 50 cm, for example, 5 cm, 10 cm, 15 cm, 20 cm, 30 cm, 40 cm, or the like. Further, the doped polycrystalline ceramic optical device 120 and may comprise a cross sectional area of between about 0.01 mm$^2$ and about 25 mm$^2$, for example, about 0.1 mm$^2$, 0.5 mm$^2$, 1 mm$^2$, 2 mm$^2$, 5 mm$^2$, 10 mm$^2$, 15 mm$^2$, 20 mm$^2$, or the like. Moreover, the doped polycrystalline ceramic optical device 120 may comprise a width of between about 0.1 mm and 5 mm, such as 0.5 mm, 0.75 mm, 1 mm, 2 mm, 3 mm, 4 mm, or the like, and a height of between about 0.1 mm and about 5 mm, such as 0.5 mm, 0.75 mm, 1 mm, 2 mm, 3 mm, 4 mm, or the like. The doped polycrystalline ceramic optical device 120 may also comprise an optical cavity positioned within the doped polycrystalline ceramic optical device 120. In operation, the optical cavity may trap light, such as a storage photon, within the optical cavity until the light is absorbed, for example, absorbed by the rare-earth element dopant 130 located within.

The rare-earth element dopant 130 doped into the crystal lattice 122 of the doped polycrystalline ceramic optical device 120 includes one or more rare-earth elements, for example, one or more lanthanide elements, including erbium, thulium, praseodymium, lanthanum, cerium, neodymium, samarium, europium, gadolinium, terbium, dysprosium, holmium, ytterbium, and lutetium, or the like, as well non-lanthanide elements such as scandium, and oxides of each of these lanthanide and non-lanthanide rare-earth elements. Further, the rare-earth element dopant 130 may comprise between about 0.01% and about 2% of the total molecular weight of doped polycrystalline ceramic optical device 120, for example, 0.025%, 0.05%, 0.075%, 0.1%, 0.125%, 0.15%, 0.2%, 0.25%, 0.5%, 0.75%, 1.0%, 1.25%, 1.5%, 1.75%, or the like. As one example, the rare-earth element dopant 130 comprises between about 0.05% to about 0.15% of a total molecular weight of the doped polycrystalline ceramic optical device 120.

The rare-earth element dopant 130 doped into the crystal lattice 122 of the doped polycrystalline ceramic optical device 120 may include a shaped spectral structure positioned within the rare-earth element dopant 130, the shaped spectral structure comprising a superposition (e.g., of one or more electrons of the rare-earth element dopant 130) that is transferable between a plurality of energy states. For example, as explained in more detail below, one or more pump lasers 180 may irradiate the doped polycrystalline ceramic optical device 120 to generate the shaped spectral structure within the rare-earth element dopant 130. In operation, the superposition of the shaped spectral structure is transferrable between energy states, for example, when the doped polycrystalline ceramic optical device 120 receives one or more storage photons emitted by the storage photon generator 170 and/or one or more pump pulses emitted by the one or more pump lasers 180, as described in more detail below. In operation, ions of rare-earth elements have narrow 4$f$-4$f$ transitions and have long optical coherence, which makes them suitable for transferring the superposition of the shaped spectral structure between energy states to store the storage photon within the rare-earth element dopant 130. Moreover, the doped polycrystalline ceramic optical device 120 may also be doped with non-rare-earth element dopants, such as oxides of Mg, Ca, Sc, Ti, V, Nb, Ta, Mo, W, Sn, and In.

Further, the doped polycrystalline ceramic optical device 120 may formed by sintering a plurality of rare-earth doped nanoparticles 110. The plurality of rare-earth doped nanoparticles 110 may comprise $Er^{3+}$ doped $Y_2O_3$ nanoparticles. The plurality of rare-earth doped nanoparticles 110 may be formed my mixing a plurality of transition metal complexes 112, a plurality of rare-earth metal complexes 114, an organic precursor 116, and water, such as deionized water (FIGS. 3A-3E). For example, by doping $Er^{3+}$ ions into nanoparticles, such as, $Y_2O_3$ nanoparticles, using a solution phase synthesis (e.g., using the methods described below with respect to FIGS. 3A-3E) the doped polycrystalline ceramic optical device 120 formed by sintering these rare-earth doped nanoparticles 110 may comprise atomically homogenously distributed rare earth ions (e.g., $Er^{3+}$ ions).

The plurality of transition metal complexes 112 may be metal salts such as metal chlorides or metal nitrates, including zirconium salts, yttrium salts or combinations thereof. Further, the plurality of rare-earth metal complexes 114 may comprise metal complexes, for example, metal salts, of any of the rare-earth elements described above. By using rare-earth metal complexes 114 form the plurality of rare-earth doped nanoparticles 110 (e.g., diameters of 200 nm or less) the rare-earth element dopant 130 positioned within resultant doped polycrystalline ceramic optical device 120 may be more uniformly distributed within the crystal lattice 122 of the doped polycrystalline ceramic optical device 120, improving performance of the doped polycrystalline ceramic optical device 120. Moreover, the organic precursor 116 may comprise urea, ammonium hydroxide, or the like.

Referring again to FIG. 1, the storage photon generator 170 is optically coupled to the doped polycrystalline ceramic optical device 120, for example, to the first end 126 or the second end 128 of the doped polycrystalline ceramic optical device 120, and is structurally configured to generate and emit a storage photon, for example, an entangled storage photon or a non-entangled storage photon. The storage photon generator 170 comprises a photon source, for example, a laser, a laser optically coupled to a non-linear crystal, a parametric down convertor, or the like. Further, the storage photon generator 170 may generate and emit storage photons using a four-wave mixing process, or any method or process of generating photons.

In operation, the storage photon generator 170 may generate and emit storage photons having any wavelength, for example, between about 300 nm and about 10 μm, for example, 500 nm, 1550 nm, 2200 nm, or the like. As a non-limiting example, the storage photon emitted by the storage photon generator 170 may comprise a first entangled storage photon that is entangled with a second entangled storage photon simultaneously emitted by the storage photon generator 170. In operation, the first entangled storage photon may traverse the doped polycrystalline ceramic optical device 120 and the second entangled storage photon may travel along a pathway separate from the doped polycrystalline ceramic optical device 120 while remaining entangled with the first entangled storage photon.

Referring still to FIG. 1, the storage photon generator 170 may be optically coupled to the doped polycrystalline ceramic optical device 120 using a storage photon transmission fiber 172 or other waveguide device, which may extend between the storage photon generator 170 and the first or second end 126, 128 of the doped polycrystalline ceramic optical device 120. Further, the storage photon generator 170 may be optically coupled to the first or second end 126, 128 of the doped polycrystalline ceramic optical device 120 by aligning the storage photon generator 170 with the first end 126 or the second end 128, for example, using one or more alignment mechanisms 142 structurally configured to optically align the storage photon generator 170 with the doped polycrystalline ceramic optical device 120. The one or more alignment mechanisms 142 may comprise an alignment stage, an optical switch, or both. Further, the storage photon generator 170 and/or the doped polycrystalline ceramic optical device 120 may be coupled to individual alignment mechanisms 142.

The one or more pump lasers 180 are optically coupled to the doped polycrystalline ceramic optical device 120 and are each structurally configured to generate and emit pump pulses. The one or more pump lasers 180 may comprise any laser source, for example, a diode laser, an external cavity diode laser, a fiber laser, a dye laser, or the like. Further, the one or more pump lasers 180 may be structurally configured to emit pump pulses having any wavelength, for example, between about 500 nm and about 2200 nm. Moreover, the wavelength of the pump pulses generated and emitted by the one or more pump lasers 180 may be larger than the wavelength of the storage photons generated and emitted by the storage photon generator 170.

Further, as depicted in FIG. 1, the one or more pump lasers 180 may comprise a first pump laser 180a and a second pump laser 180b. For example, the first pump laser 180a may be optically coupled to the first end 126 of the doped polycrystalline ceramic optical device 120 and the second pump laser 180b may be optically coupled to the second end 128 of the doped polycrystalline ceramic optical device 120. As depicted in FIG. 1, the first pump laser 180a may be optically coupled to the same end of the doped polycrystalline ceramic optical device 120 as the storage photon generator 170 (e.g., the first end 126) and the second pump laser 180b may be optically coupled to a different end of the doped polycrystalline ceramic optical device 120 as the storage photon generator 170 (e.g., the second end 128). Optically coupling the first and second pump lasers 180a, 180b to different ends of the doped polycrystalline ceramic optical device 120 may decrease optical scattering within the doped polycrystalline ceramic optical device 120 of the storage photon during operation of the quantum memory system 100.

As depicted in FIG. 1, each pump laser 180 may be optically coupled to the doped polycrystalline ceramic optical device 120 using a pump pulse transmission fiber 182 or other waveguide device, which may extend between each pump laser 180 and the doped polycrystalline ceramic optical device 120. Further, each pump laser 180 may be optically coupled to the doped polycrystalline ceramic optical device 120 using one or more alignment mechanisms 142 structurally configured to optically align each pump laser 180 with the doped polycrystalline ceramic optical device 120. The one or more alignment mechanisms 142 may comprise an alignment stage, an optical switch, or both. Further, the one or more pump lasers 180 and/or the doped polycrystalline ceramic optical device 120 may be coupled to individual alignment mechanisms 142.

Referring again to FIG. 1, the quantum memory system 100 may further comprise a wavelength division multiplexer (WDM) 160 optically coupled to the doped polycrystalline ceramic optical device 120. In particular, the WDM 160 is optically coupled to the end of the doped polycrystalline ceramic optical device 120 where the storage photon exits the doped polycrystalline ceramic optical device 120. For example, as depicted in FIG. 1, the WDM 160 may be optically coupled to the first end 126 of the doped polycrystalline ceramic optical device 120. Further, the WDM 160 may be optically coupled to both a storage photon pathway 162 and a pump pulse pathway 164, for example, the WDM 160 may be positioned between an end (e.g., the first end 126) of the doped polycrystalline ceramic optical device 120 and both the storage photon pathway 162 and the pump pulse pathway 164. The WDM 160 is configured to direct the storage photons into the storage photon pathway 162 and direct the pump pulses into the pump pulse pathway 164. For example, the WDM 160 may direct a wavelength range of photons encompassing the wavelengths of the storage photons into the storage photon pathway 162 and may direct a wavelength range of photons encompassing the wavelengths of the pump pulses into the pump pulse pathway 164. Further, the storage photon pathway 162 and the pump pulse pathway 164 may comprise optical fibers.

The storage photon pathway 162 may extend between the WDM 160 and a storage photon receiver 166. As one non-limiting example, the storage photon receiver 166 may comprise an optical fiber link of one or more photon entanglement chains of the quantum key generation system described in U.S. patent application Ser. No. 14/680,522. As another non-limiting example, the storage photon receiver 166 may comprise repeater entanglement optics 210 of the quantum repeater system 201 of FIG. 4. Further, the pump pulse pathway 164 may extend between the WDM 160 and a pump pulse receiver 168. In operation, the first and second pump pulses may terminate at the pump pulse receiver 168, for example, the pump pulse receiver 168 may comprise a fiber end in embodiments in which the pump pulse pathway 164 comprises an optical fiber.

Referring still to FIG. 1, the quantum memory system 100 may further comprise an optical circulator 150 optically coupled the doped polycrystalline ceramic optical device 120, for example, to the first end 126 of the doped polycrystalline ceramic optical device 120. The optical circulator 150 comprises three or more optical ports, for example, a first optical port 152, a second optical port 154, and a third optical port 156. Further, the optical circulator 150 is positioned between the storage photon generator 170 and the doped polycrystalline ceramic optical device 120, for example, the first end 126 of the doped polycrystalline ceramic optical device 120 such that a first optical port 152 of the optical circulator 150 is optically coupled to the storage photon generator 170 and the second port is optically coupled to the first end 126 of the doped polycrystalline ceramic optical device 120.

The optical circulator 150 may also be positioned between at least one of the pump lasers 180 (e.g., the first pump laser 180a) and the first end 126 of the doped polycrystalline ceramic optical device 120 such that the first optical port 152 of the optical circulator 150 is optically coupled to at least one of the one or more pump lasers 180 and the second optical port 154 is optically coupled to the first end 126 of the doped polycrystalline ceramic optical device 120. For example, as depicted in FIG. 1, the storage photon generator 170 and the first pump laser 180a are each optically coupled to the first optical port 152 of the optical circulator 150 such that storage photons output by the storage photon generator 170 and the first pump pulse output by the first pump laser 180a enter the first optical port 152 of the optical circulator 150 and exit the second optical port 154 towards the first end 126 of the doped polycrystalline ceramic optical device 120.

The optical circulator 150 may also be positioned between the WDM 160 and the doped polycrystalline ceramic optical device 120, for example, the first end 126 of the doped polycrystalline ceramic optical device 120. Further, the third optical port 156 of the optical circulator 150 is optically coupled to the WDM 160. For example, the WDM 160 is positioned adjacent and optically coupled to the third optical port 156 of the optical circulator 150 such that the WDM 160 receives the storage photon after the storage photon exits the first end 126 of the doped polycrystalline ceramic optical device 120 and may receive one or both of the pump pulses output by the first and second pump lasers 180a, 180b.

As depicted in FIG. 1, the quantum memory system 100 may further comprise a cooling system 190 thermally coupled to the doped polycrystalline ceramic optical device 120. As a non-limiting example, the cooling system 190 may comprise a cooling chamber and the doped polycrystalline ceramic optical device 120 may be positioned within the cooling chamber. As another non-limiting example, the cooling system 190 may comprise a laser cooling system and the doped polycrystalline ceramic optical device 120 may be optically coupled to the laser cooling system. It should be understood that any cooling system 190 structurally configured to cool the doped polycrystalline ceramic optical device 120 is contemplated.

Referring still to FIG. 1, the magnetic field generation unit 140 may comprise any magnetic device structurally and compositionally configured to generate a magnetic field, for example, a static magnetic field. As non-limiting examples, the magnetic field generation unit 140 may comprise an electromagnet, a ferromagnet, an alcnico magnet, a samarium cobalt (SmCo) magnet, a neodymium iron boron (NdFeB) magnet, or combinations thereof. Further, the magnetic field generation unit 140 is positioned within the quantum memory system 100 such that, when the magnetic field generation unit 140 generates a magnetic field, the doped polycrystalline ceramic optical device 120 is positioned within the magnetic field of the magnetic field generation unit 140. For example, the magnetic field generation unit 140 may be adjacent the doped polycrystalline ceramic optical device 120. As a non-limiting example, the magnetic field generation unit 140 may be structurally and compositionally configured to generate a magnetic field comprising a magnetic flux density of between about 0.2 tesla and about 5 tesla, such as about 0.4 tesla, 0.5 tesla, 0.6 tesla, 0.65 tesla, 0.7 tesla, 0.8 tesla, 1 tesla, 2 tesla, 2.5 tesla, 3 telsa, 4 tesla, or the like.

Figure 2:
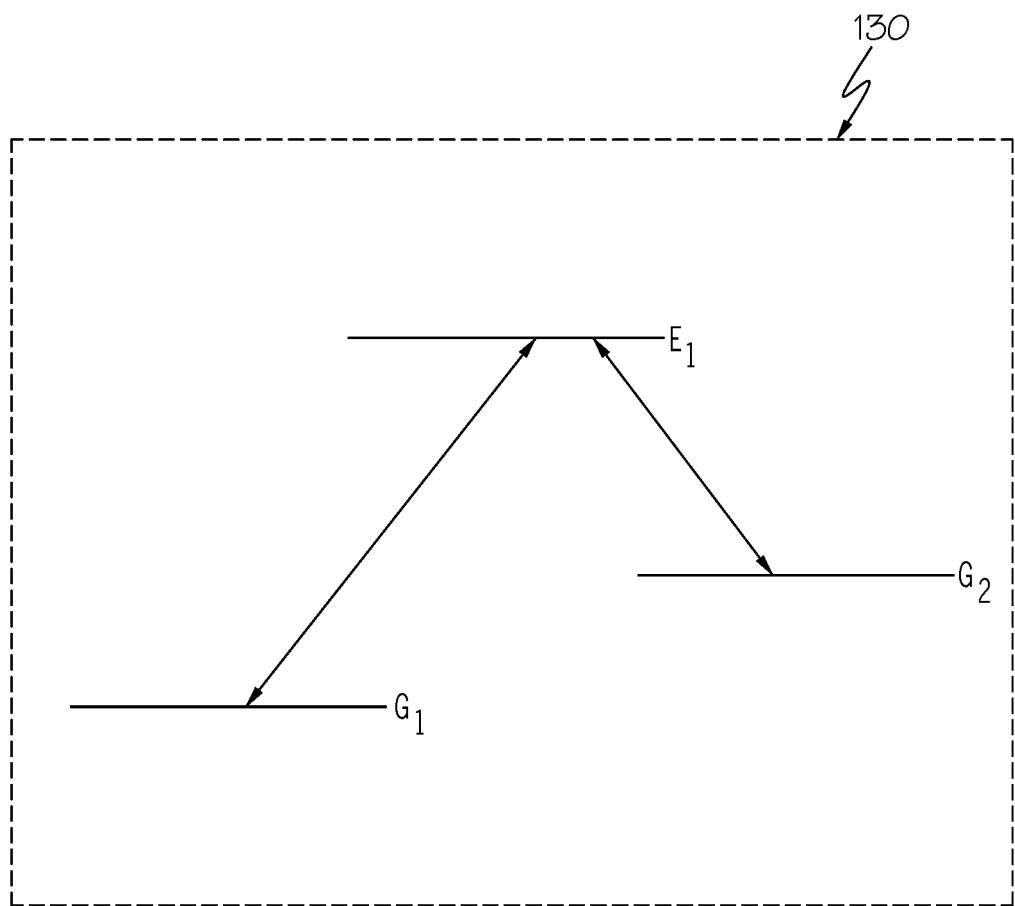
FIG. 2 is a schematic illustration of ground and excited energy states of a superposition of a shaped spectral structure of the rare-earth element dopant of FIG. 1, according to one or more embodiments shown and described herein.

As schematically depicted in FIG. 2, when the doped polycrystalline ceramic optical device 120 is positioned within the magnetic field of the magnetic field generation unit 140 and the one or more pump lasers 180 have irradiated the doped polycrystalline ceramic optical device 120 to generate the shaped spectral structure within the rare-earth element dopant 130, a ground state of the superposition of the shaped spectral structure of the rare-earth element dopant 130 is split such that each superposition of the shaped spectral structure of the rare-earth element dopant 130 comprises a first split ground state $G_1$, a second split ground state $G_2$ and an excited energy state $E_1$. By splitting the ground state of the superposition of the shaped spectral structure of the rare-earth element dopant 130, the superposition of the shaped spectral structure may be transferred into the second ground state $G_2$ to store the storage photon within the doped polycrystalline ceramic optical device 120, as described below.

In operation, the doped polycrystalline ceramic optical device 120 doped with the rare-earth element dopant 130 is structurally and compositionally configured to absorb and store a storage photon emitted by the storage photon generator 170. For example, the shaped spectral structure may be generated in the doped polycrystalline ceramic optical device 120, for example, in the rare-earth element dopant 130, using one or more pump pulses output by the pump laser 180. For example, the shaped spectral structure may comprise an atomic frequency comb (AFC), controlled reversible inhomogeneous broadening (CRIB), or any known or yet-to-be developed shaped spectral structure, for example, shaped spectral structures formed by using spectral hole burning. Example shaped spectral structures are described in Hastings-Simon et al., "Controlled Stark shifts in $Er^{3+}$-doped crystalline and amorphous waveguides for quantum state storage," Optics Communications, 266, pgs. 716-719 (2006), Afzelius et al, "Multimode quantum memory based atomic frequency combs," Physical Review A 79, 052326 (2009), and Nilsson et al., "Solid state quantum memory using complete absorption and re-emission of photons by tailored and externally controlled inhomogeneous absorption profiles," Optics Communications, 247, pgs. 393-403 (2005).

Next, when the storage photon is traversing the doped polycrystalline ceramic optical device 120, the storage photon may transfer the superposition of the shaped spectral structure of the rare-earth element dopant 130 from the first split ground state $G_1$ to the excited energy state $E_1$, as schematically shown in FIG. 2, to absorb the storage photon. Next, upon receipt of a first pump pulse output by the first pump laser 180a, the first pump pulse may transfer the superposition of the shaped spectral structure of the rare-earth element dopant 130 from the excited energy state $E_1$ into the second split ground state $G_2$, to store the storage photon. Moreover, the output from the pump laser may comprise a π-pulse.

Further, the doped polycrystalline ceramic optical device 120 doped with the rare-earth element dopant 130 is structurally and compositionally configured to release, on demand, the storage photon stored within the doped polycrystalline ceramic optical device 120. For example, upon receipt of a second pump pulse output by the second pump laser 180b, the superposition of the shaped spectral structure of the rare-earth element dopant 130 is transferred from the second split ground state $G_2$ back to the excited energy state $E_1$. Once in the excited energy state $E_1$, the superposition of the shaped spectral structure of the rare-earth element dopant 130 will automatically release the storage photon after a delay period, such that the storage photon exits the doped polycrystalline ceramic optical device 120, for example, the first end 126 of the doped polycrystalline ceramic optical device 120. For example, once in the excited energy state $E_1$, the shaped spectral structure of the rare-earth element dopant 130 will rephase, and after the delay period, the storage photon will exit the doped polycrystalline ceramic optical device 120. Moreover, the storage photon may exit the first end 126 of the doped polycrystalline ceramic optical device 120 when the second pump laser 180b emits the second pump pulse into to the second end 128 of the doped polycrystalline ceramic optical device 120 and the storage photon may exit the second end 128 of the doped polycrystalline ceramic optical device 120 when the second pump laser 180b emits the second pump pulse into the first end 126 of the doped polycrystalline ceramic optical device 120.

The delay period comprises a consistent, repeatable time period, thus, upon repeated operation, individual storage photons are released after the same delay period. Further, different doped polycrystalline ceramic optical devices 120 may comprise the same or different delay periods. As a non-limiting example, doped polycrystalline ceramic optical devices 120 comprising the same polycrystalline ceramic and dopant composition may comprise equal delay periods. Thus, a pair of the doped polycrystalline ceramic optical devices 120 having equivalent delay periods may be arranged as the quantum repeater system 201 of the optical system 200 of FIG. 4 and will each release storage photons simultaneously if they each receive the second pump pulse simultaneously, to facilitate quantum entanglement of storage photons using the repeater entanglement optics 210 of FIG. 4, as described below. Further, the delay period of the individual doped polycrystalline ceramic optical device 120 may be determined by performing a photon echo measurement on the individual the doped polycrystalline ceramic optical device 120.

Referring again to FIG. 1, the doped polycrystalline ceramic optical device 120 may comprise a low phonon energy (e.g., Debye energy), which may limit unintended electron dephasing. For example, the doped polycrystalline ceramic optical device 120 may comprise a phonon energy of between about 100 $cm^{-1}$ and about 800 $cm^{-1}$, for example, 200 $cm^{-1}$, 300 $cm^{-1}$, 400 $cm^{-1}$, 500 $cm^{-1}$, 600 $cm^{-1}$, 700 $cm^{-1}$, or the like. Electron dephasing refers to phonon assisted coupling from a trapped electron orbital to a degenerate or nearly degenerate orbital. Unintended electron dephasing refers to energy state transfer (e.g. phonon assisted coupling) into the first ground state $G_1$ by the superposition of the shaped spectral structure of the rare-earth element dopant 130, that causes unintentional release of the storage photon before the desired release of the storage photon. For example, unintended electron dephasing refers to electron (e.g., superposition) dephasing that occurs before receipt of the first pump pulse or the second pump pulse by the doped polycrystalline ceramic optical device 120. Further, lowering unintended electron dephasing may facilitate longer photon storage lifetimes and greater photon storage efficiency.

By lowering the phonon energy of the doped polycrystalline ceramic optical device 120, the photon storage lifetime and the photon storage efficiency of the doped polycrystalline ceramic optical device 120 may be increased. Photon storage lifetime refers to the maximum amount of time a storage photon may remain stored within the doped polycrystalline ceramic optical device 120 before unintended electron (e.g., superposition) dephasing causes the storage photon to be released. Further, photon storage efficiency refers to the percentage of storage photons traversing the doped polycrystalline ceramic optical device 120 that are absorbed and stored. Moreover, the doped polycrystalline ceramic optical device 120 comprises low attenuation, increasing the photon storage efficiency. Attenuation may be lowered by reducing scattering, for example, by optically coupling the first and second pump lasers 180a, 180b to opposite ends of the doped polycrystalline ceramic optical device 120, as depicted in FIG. 1. Further, attenuation may be lowered by reducing the number of voids in the doped polycrystalline ceramic optical device 120. In some embodiments, the doped polycrystalline ceramic optical device 120 is voidless.

Further, uniformly distributing the rare-earth element dopant 130 within the crystal lattice 122 of the doped polycrystalline ceramic optical device 120 may prevent clustering of the rare-earth element dopant 130 at the grain boundaries between individual crystals of the doped polycrystalline ceramic optical device 120. The uniform distribution may reduce spin-spin interactions, thereby reducing unintended electron decay. Moreover, by cooling the doped polycrystalline ceramic optical device 120, for example, using the cooling system 190, the phonon population of the doped polycrystalline ceramic optical device 120 may be reduced, increasing the photon storage lifetime and the photon storage efficiency of the doped polycrystalline ceramic optical device 120.

The doped polycrystalline ceramic optical device 120 may also comprise elements with a nuclear magnetic moment of about $3\mu_N$ or less, for example, about $1\mu_N$ or less. In operation, lower magnetic moments are correlated with longer photon storage lifetime because of smaller magnetic dipole-dipole interaction of the element having a low nuclear magnetic moment to the rare-earth element dopant 130. As a non-limiting example, elements such as Y, Sn, and Pb, which each comprise low magnetic moments, may also be present in the doped polycrystalline ceramic optical device 120. Further, doped polycrystalline ceramic optical devices 120 comprising materials having higher atomic weights may be desired because heavier elements may also comprise lower phonon energy.

The doped polycrystalline ceramic optical device 120 doped with the rare-earth element dopant 130 may also comprise a narrow homogeneous linewidth, which may increase the photon storage lifetime and photon storage efficiencies of the doped polycrystalline ceramic optical device 120 doped with the rare-earth element dopant 130. In particular, a narrower homogeneous linewidth is directly correlated with a longer photon storage lifetime. As used herein, inhomogeneous linewidth refers to the full-width half maximum (FWHM) spectral linewidth of the absorption peak (e.g., wavelength at which maximum absorption occurs) of the rare-earth element dopant 130 of the doped polycrystalline ceramic optical device 120. The inhomogeneous linewidth the doped polycrystalline ceramic optical device 120 doped with the rare-earth element dopant 130 may comprise between about 1 nm and about 25 nm, between about 5 nm and 15 nm, or the like, for example, 2 nm, 5 nm, 10 nm, 15 nm, 20 nm, or the like. Moreover, the homogeneous linewidth of the doped polycrystalline ceramic optical device 120 doped with the rare-earth element dopant 130 may comprise about 7.5 MHz or less, for example, 7 MHz, 6 MHz, 5 MHz 4 MHz, 3 MHz, 2 MHz, 1 MHz, or the like.

As one non-limiting example, the absorption peak of the doped polycrystalline ceramic optical device 120 doped with the rare-earth element dopant 130 comprising erbium may be between about 1510 nm and about 1550 nm, for example, between about 1535 nm and about 1545 nm, such as 1540 nm. As another non-limiting example, the absorption peak of the doped polycrystalline ceramic optical device 120 doped with the rare-earth element dopant 130 comprising thulium may be between about 1600 nm and about 1700 nm, for example, between about 1625 nm and about 1675 nm, such as 1660 nm. Further, in operation, the doped polycrystalline ceramic optical device 120 doped with the rare-earth element dopant 130 is configured to absorb and store a storage photon traversing the doped polycrystalline ceramic optical device 120, as described above, upon receipt of a first pump pulse output by the first pump laser 180a that comprises a wavelength within 15 nm of the wavelength of the absorption peak, for example, within 10 nm, within 5 nm, or equal to the wavelength of the absorption peak. Further, the doped polycrystalline ceramic optical device 120 doped with the rare-earth element dopant 130 may release the storage photon, as described above, upon receipt of a second pump pulse output by the second pump laser 180b that comprises a wavelength within 15 nm of the wavelength of the absorption peak, for example, within 10 nm, within 5 nm, or equal to the wavelength of the absorption peak.

The relationship between photon storage lifetime and homogeneous linewidth may be mathematically described with the following equations:

$$\rho_1 = \frac{1}{c} \frac{3}{2\pi\rho v^5 \hbar^4} |\langle \psi_i^{el} | V_1 | \psi_j^{el} \rangle|^2 \text{ and}$$

$$\rho_2 = \frac{1}{c} \frac{3}{2\pi\rho v^5 \hbar^4} |\langle \psi_i^{el} | V_2 | \psi_j^{el} \rangle|^2,$$

where, $V_1$ is the first spatial derivative of the crystal field of the doped polycrystalline ceramic optical device 120, $V_2$ is the second spatial derivative of the crystal field of the doped polycrystalline ceramic optical device 120, $\rho_1$ is the probability amplitude of the transition due to the $V_1$, $\rho_2$ is the probability of the transition due to $V_2$, c is the speed of light, $\rho$ is the density of the host material, for example, the doped polycrystalline ceramic optical device 120, v is the average velocity of a sound wave in the crystal, $\psi_i^{el}$ is the ground state of the electron (e.g., the electron of the rare-earth element dopant 130), and $\psi_j^{el}$ is the excited state of the electron (e.g., the electron of the rare-earth element dopant 130). Further, a phonon coupling coefficient $\beta_{ij}$ may be mathematically described as $\beta_{ij} = h^3 c \omega_{ij}^3 \rho_1$, where c is the speed of light, $\omega_i$ is the homogeneous linewidth of the doped polycrystalline ceramic optical device 120, and $\rho_1$ is the is the first order probability amplitude of the transition. As shown above, smaller (e.g., narrower) homogeneous linewidths generate smaller photon coupling coefficients. Further, a small phonon coupling coefficient is correlated with low phonon energy and low phonon energy facilitates longer photon storage lifetimes. Thus, the homogeneous linewidth is inversely proportional to the photon storage lifetime and narrower homogeneous linewidth facilitate longer photon storage lifetimes.

Combining the above equations, the homogeneous lifetime may also be mathematically described as $$w_i^{hom}(cm^{-1}) = \frac{2\hbar c(kT_D)^7}{\pi}\left[\sum_{k\neq j}\frac{p_1}{E_i - E_j} + p_2\right]^2\left(\frac{T}{T_D}\right)^7 \int_0^{T_D/T}\frac{x^6 e^x}{(e^x - 1)^2}dx +$$
$$p_1\left\{\sum_{j<i}\Delta E_{ij}^3\left(\frac{e^{\Delta E_{ij}/kT}}{e^{\Delta E_{ij}/kT} - 1}\right) + \sum_{j>i}\Delta E_{ji}^3\left(\frac{1}{e^{\Delta E_{ji}/kT} - 1}\right)\right\}$$

where c is the speed of light, k is the Boltzmann constant, T is the temperature (e.g., the temperature of the doped polycrystalline ceramic optical device 120), $T_D$ is the Debye temperature, $\rho_1$ is the first order probability amplitude of the transition, $\rho_2$ is the second order probability amplitude of the transition, and E is the energy level.

In some embodiments, the rare-earth element dopant 130 may comprise a non-Kramers rare-earth ion, such as $Pr^{3+}$, $Tm^{3+}$, or the like. Doped polycrystalline ceramic optical device 120 doped with non-Kramers rare-earth ions may comprise a narrower homogeneous linewidth than doped polycrystalline ceramic optical devices 120 doped with Kramers rare-earth ions, for example, due to the lack of Kramers degeneracy of non-Kramers rare-earth ions. This may increase the photon storage lifetime of the doped polycrystalline ceramic optical device 120 and reduce unintended electron decay. Moreover, when the rare-earth element dopant 130 comprises thulium, the electrons of the rare-earth element dopant 130 comprising thulium may split into first and second ground states $G_1$ and $G_2$ (FIG. 2) when positioned within a weaker magnetic field than a rare-earth element dopant 130 comprising erbium.

Referring again to FIGS. 1 and 2, a method of storing and releasing a storage photon using the quantum memory system 100 is contemplated. While the method is described below in a particular order, it should be understood that other orders are contemplated. Referring now to FIG. 1, the method may first comprise generating a magnetic field using the magnetic field generation unit 140. As stated above, generating a magnetic field using the magnetic field generation unit 140 causes the ground state of electrons of the rare-earth element dopant 130 doped is split into the first ground state $G_1$ and the second ground state $G_2$, as depicted in FIG. 2.

The method further generating a shaped spectral structure within the rare-earth element dopant 130 of the doped polycrystalline ceramic optical device 120 by irradiating the doped polycrystalline ceramic optical device 120 with a plurality of pump pulses output by the a one or more pump lasers 180. Next, the method comprises emitting a storage photon from the storage photon generator 170 optically coupled to the doped polycrystalline ceramic optical device 120 and upon receipt of the storage photon by the doped polycrystalline ceramic optical device 120, the rare-earth element dopant 130 doped within the doped polycrystalline ceramic optical device 120 absorbs the storage photon by transferring a superposition of the shaped spectral structure of the rare-earth element dopant 130 from the first split ground state $G_1$ to the excited energy state $E_1$. For example, the storage photon may comprise a wavelength of between about 300 nm and about 10 µm, for example, 500 nm, 1550 nm, 2200 nm. Next, the method further comprises emitting a first pump pulse from the first pump laser 180a optically coupled to the doped polycrystalline ceramic optical device 120 such that the first pump pulse transfers the superposition of the shaped spectral structure of the rare-earth element dopant 130 from the excited energy state to a second split ground state $G_2$, upon receipt of the first pump pulse by the doped polycrystalline ceramic optical device 120, to store the storage photon within the doped polycrystalline ceramic optical device 120.

Referring still to FIGS. 1 and 2, the method further comprises emitting a second pump pulse from the second pump laser 180b such that the second pump pulse transfers the superposition of the shaped spectral structure of the rare-earth element dopant 130 from the second split ground state $G_2$ to the excited energy state $E_1$, upon receipt of the second pump pulse by the doped polycrystalline ceramic optical device 120. Once back in the excited energy state $E_1$, the superposition of the shaped spectral structure of the rare-earth element dopant 130 will automatically release the storage photon after a delay period, such that the storage photon exits the doped polycrystalline ceramic optical device 120.

Further, in operation, the quantum memory system 100 and more particularly, the doped polycrystalline ceramic optical device 120 doped with a rare-earth element dopant 130 may absorb and store a storage photon for a photon storage lifetime comprising between about 500 ns and about 1 ms, for example, between about 1 µs and about 1 ms or between about 10 µs and about 1 ms. Moreover, in operation, the quantum memory system 100 and, more particularly, the doped polycrystalline ceramic optical device 120 doped with a rare-earth element dopant 130 may absorb and store about 50% or more of a plurality of storage photons traversing the doped polycrystalline ceramic optical device 120, for example, about 70% or more of the plurality of storage photons traversing the doped polycrystalline ceramic optical device 120, about 90% or more of the plurality of storage photons traversing the doped polycrystalline ceramic optical device 120, or the like.

Figure 3B:
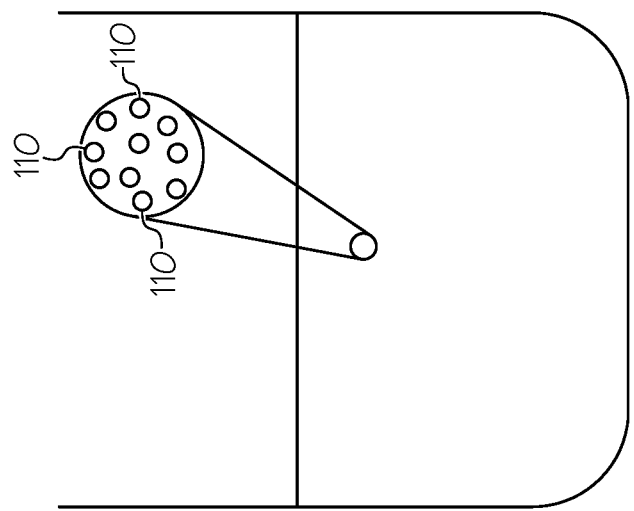
FIG. 3B is a schematic illustration of a plurality of rare-earth doped nanoparticles used to form the doped polycrystalline ceramic optical device of FIG. 1, according to one or more embodiments shown and described herein.
Figure 3A:
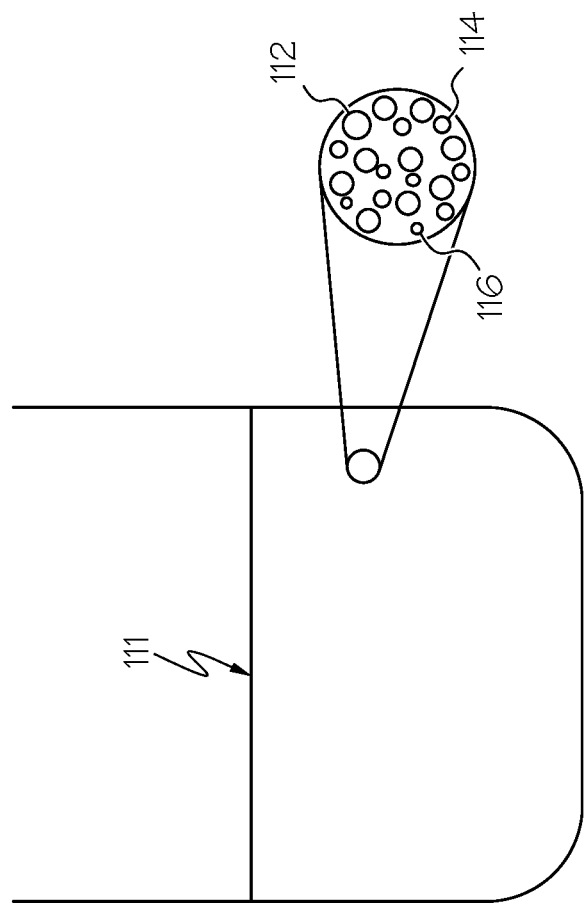
FIG. 3A is a schematic illustration of a precursor mixture used to form the doped polycrystalline ceramic optical device of FIG. 1, according to one or more embodiments shown and described herein.

Referring now to FIGS. 3A and 3B, a method of manufacturing the doped polycrystalline ceramic optical device 120 of FIG. 1 is contemplated. While the method is described below in a particular order, it should be understood that other orders are contemplated. As depicted in FIG. 3A, the method first comprises mixing a plurality of transition metal complexes 112, a plurality of rare-earth metal complexes 114, an organic precursor 116, and water, such as, deionized water, to form a precursor mixture 111. The plurality of transition metal complexes 112 may comprise metal complexes, such as metal salts, which include a transition metal, for example, zirconium, yttrium, or combinations thereof. Further, the transition metals of plurality of transition metal complexes 112 may include cubic crystals of a dielectric material and may each comprise a cross-sectional dimension (e.g., diameter) of between about 25 nm and about 250 nm, for example, 50 nm, 75 nm, 100 nm, 125 nm, 150 nm, 200 nm, or the like. As one example, the plurality of transition metal complexes 112 may comprise $YCl_3 \cdot 6H_2O$.

Further, the plurality of rare-earth metal complexes 114 may comprise metal complexes, such as metal salts, that include any of the rare-earth elements described above. As one example, the rare-earth metal complexes 114 may comprise $ErCl_3 \cdot 6H_2O$. As stated above, by using rare-earth metal complexes 114 to form the plurality of rare-earth doped nanoparticles 110 the rare-earth element dopant 130 positioned within resultant doped polycrystalline ceramic optical device 120 may be more uniformly distributed within the crystal lattice 122 of the doped polycrystalline ceramic optical device 120, improving performance of the doped polycrystalline ceramic optical device 120. Moreover, the organic precursor 116 may comprise urea, ammonium hydroxide, or the like.

As one example, the precursor mixture 111 may include between about 40 g and about 80 g of the transition metal complexes 112, for example, about 50 g, 60 g, 65 g, 65.53 g, 70 g, or the like. The precursor mixture 111 may also include between about 0.01 g and about 0.5 g of the rare-earth metal complexes 114, for example, about 0.05 g, 0.1 g, 0.15 g, 0.2 g, 0.25 g, 0.35 g, or the like. Further, the precursor mixture 111 may include between about 350 g and about 450 g of the organic precursor 116, for example, about 375 g, 388.8 g, 400 g, 425 g, or the like. Moreover, the precursor mixture 111 may include between about 2 L and about 6 L of deionized water, for example, about 3 L, 4 L, 4.32 L, 5 L, or the like.

Referring still to FIGS. 3A and 3B, the method further comprises heating the plurality of transition metal complexes 112, the plurality of rare-earth metal complexes 114, the organic precursor 116, and the deionized water (e.g., the precursor mixture 111) to a heating temperature for a heating period to induce thermal decomposition of the organic precursor 116 and generate a chemical reaction between the transition metal complexes 112, the rare-earth metal complexes 114, and the organic precursor 116 to produce a plurality of rare-earth doped nanoparticles 110, as depicted in FIG. 3B. For example, the heating temperature may be between about 70° C. and about 100° C., such as about 80° C., 90° C., 95° C., or the like, and the heating period may be between about 0.5 hours and about 3 hours, such as, 1 hour, 2 hours, or the like.

In operation, the thermal decomposition of the organic precursor 116, such as urea, may produce $OH^-$ and $CO_3^{2-}$, which react with the transition metals of the plurality of transition metal complexes 112 and the rare-earth metals of the plurality of rare-earth metal complexes 114 to produce the plurality of rare-earth doped nanoparticles 110, for example, $Y_{1-x}Er_x(OH)CO_3 \cdot H_2O$ nanoparticles. Further, the $Y_{1-x}Er_x(OH)CO_3 \cdot H_2O$ nanoparticles may be filtered and collected then annealed at an annealing temperature of between about 500° C. and about 900° C., such as about 600° C., 700° C., 800° C., or the like, to convert the $Y_{1-x}Er_x(OH)CO_3 \cdot H_2O$ rare-earth doped nanoparticles 110 into $(Y_{1-x}Er_x)_2O_3$ rare-earth doped nanoparticles 110. Once annealed, the rare-earth doped nanoparticles 110 may comprise a crystalline structure. Moreover, the chemical yield of the rare-earth doped nanoparticles 110 may be between about 85% and about 98%, for example 88%, 90%, 92%, 95%, or the like.

The diameter of the plurality of rare-earth doped nanoparticles 110 may be altered by varying the concentration of the plurality of transition metal complexes 112 in the precursor mixture 111. As one example, when the concentration of plurality of transition metal complexes 112 in the precursor mixture 111 is about 0.0125 M, the diameter of the resulting rare-earth doped nanoparticles 110 may be about 100 nm. As another example, when the concentration of plurality of transition metal complexes 112 in the precursor mixture 111 is about 0.05 M, the diameter of the resulting rare-earth doped nanoparticles 110 may be about 150 nm. Further, it may be desirable that the plurality of transition metal complexes 112 in the precursor mixture 111 is less than 0.05 M, because the resulting rare-earth doped nanoparticles 110 may be non-uniform and agglomerated if the concentration of transition metal complexes 112 in the precursor mixture 111 is greater than 0.05 M.

Further, the amount of rare-earth element dopant in the plurality of rare-earth doped nanoparticles 110 may be altered by changing the ratio of transition metal complexes 112 and rare-earth metal complexes 114 in the precursor mixture 111. As one example, when the ratio of the transition metal complexes 112 and the rare-earth metal complexes 114 is about 137 parts of the plurality of transition metal complexes 112 to about 1 part of the plurality of rare-earth metal complexes 114, the resulting rare-earth doped nanoparticles 110 may comprise about 0.97% rare-earth element dopant. As another example, when the ratio of the plurality of transition metal complexes 112 and the plurality of rare-earth metal complexes 114 is about 548 parts of the plurality of transition metal complexes 112 to about 1 part of the plurality of rare-earth metal complexes 114, the resulting rare-earth doped nanoparticles 110 may comprise about 0.25% rare-earth element dopant.

The method may further include milling the plurality of rare-earth doped nanoparticles 110 using a milling media, for example, a yttria stabilized grinding media, such as YTZ® grinding media manufactured by Tosoh Corporation, Tokyo Japan. The milling media may comprise a diameter between about 1 mm and 3 mm, for example, 1.5 mm, 2 mm, 2.5 mm, or the like. Further, additional materials may be added before or during the milling process, for example, a mixture of ethanol solvents, 1-butanol, propylene glycol, organophosphate, such as Phosphalon™ PS-236, and deionized water. In operation, the rare-earth doped nanoparticles 110 may be milled for between about 75 hours and about 100 hours, for example, about 80 hours, 85 hours, 90 hours, 95 hours, or the like. Moreover, the rare-earth doped nanoparticles 110 may be milled using a VIBRA-MILL® milling system.

As one example, about 25 g of the rare-earth doped nanoparticles 110 may be milled using between about 100 g and about 150 g of milling media, for example, 110 g, 120 g, 130 g, 140 g, or the like. Further, the additional materials added before or during the milling process may include about 15 g and about 20 g of ethanol solvents, for example, about 16 g, 17 g, 18 g, 18.3 g, 19 g, or the like, between about 2 g and about 6 g of 1-butanol, for example, about 3 g, 4 g, 4.4 g, 5 g, or the like, between about 0.5 g and about 1.5 g of propylene glycol, such as about 1.0 g, between about 0.25 g and about 0.5 g of an organophosphate, such as Phosphalon™ PS-236, for example, about 0.3 g. 0.35 g, 0.38 g, 0.4 g, 0.45 g, or the like, and between about 0.5 g and about 2.5 g of deionized water, for example, about 1 g, 1.3 g, 1.5 g, 2 g, or the like.

In operation, the milling process disperses the plurality of rare-earth doped nanoparticles 110 into a slurry, which may be separated from the milling media during a filtration process, for example, using a screen. Next, one or more binders, such as Butvar® polyvinyl butyral (PVB-B98) and one or more plasticizers, such as dibutyl phthalate, may be added to the slurry having the rare-earth doped nanoparticles 110, which may then be mixed, for example, using a Mazerustarm planetary mixer (such as model KK-400W). Next, the slurry having the plurality of rare-earth doped nanoparticles 110 may be rolled, for example, using rollers operating at about 25 RPM for about 18-24 hours to remove air within the slurry having the rare-earth doped nanoparticles 110. By removing air, the resulting doped polycrystalline ceramic optical device 120 (e.g., formed using the sintering process described below) may be voidless. In operation, a longer milling process, for example, a milling process of about 90 hours or longer, may be desired to reduce the voids and increase the transparency of the resultant doped polycrystalline ceramic optical device 120.

In some embodiments, the slurry having the rare-earth doped nanoparticles 110 may be cast into a film using a casting process such as a tape casting process, for example, using a TAM Ceramics® hydraulically driven tape caster. After casting, the film having the rare-earth doped nanoparticles 110 may be dried, for example, by covering the film with a covering material such that an air gap is located between the film and the covering material for a drying period, for example, between about 18 hours and about 24 hours, e.g., 20 hours, 22 hours, or the like. Next, the film having the rare-earth doped nanoparticles 110 may be dried in a drying oven at about 50° C. for about 20-25 mins, which may remove organics present in the film having the rare-earth doped nanoparticles 110. Further, the film having the rare-earth doped nanoparticles 110 may have a thickness of about 100 µm or less, for example, about 75 µm, 50 µm, 25 µm, 20 µm, 15 µm, 10 µm, or the like.

The method of manufacturing the doped polycrystalline ceramic optical device 120 may further comprise sintering the plurality of rare-earth doped nanoparticles 110, for example, sintering the film having the rare-earth doped nanoparticles 110 to form the doped polycrystalline ceramic optical device 120 having a rare-earth element dopant 130, described above. Before sintering, the film having the rare-earth doped nanoparticles 110 may be placed on a setter, such as an alumina setter. Once placed on the setter, the film having the rare-earth doped nanoparticles 110 may be sintered using a sintering furnace, such as a CM™ Furnace.

As one example, during the sintering process, the film having the rare-earth doped nanoparticles 110 may be sintered using the following sintering schedule. First, the film having the rare-earth doped nanoparticles 110 may be heated from room temperature to 200° C. for a heating period of about 1 hour then the film may be heated from about 200° C. to about 500° C. for a heating period of about 2 hours then heated from 500° C. to about 1550° C. for a heating period of about 5 hours. Next, the film having the rare-earth doped nanoparticles 110 may be maintained at a temperature of about 1550° C., for example, a temperature at least about 1500° C. or greater, for a dwelling period of about 2 hours, then cooled from 1550° C. to about room temperature over a cooling period of about 3 hours. In operation, a higher maximum temperature during the sintering process, for example, a maximum temperature of about 1550° C. or more may be desired to reduce the voids and increase the transparency of the resultant doped polycrystalline ceramic optical device 120.

In other embodiments, the plurality of rare-earth doped nanoparticles 110 may be pressed into a pellet before undergoing the sintering process. For example, the plurality of rare-earth doped nanoparticles 110 may be pressed into a pellet instead of being formed into a slurry then cast into a film. In operation, the plurality of rare-earth doped nanoparticles 110 may be pressed, for example, uni-axially pressed, iso-statically pressed, or both into a pellet having the rare-earth doped nanoparticles 110. The pellet having the rare-earth doped nanoparticles 110 may be uni-axially pressed in a ¾ inch steel die at about 8 K pounds force and/or iso-statically pressed at about 25 Kpsi using an iso-pressing sheath, for example, a latex iso-pressing sheath. After pressing, the pellets may be sintered. During the sintering process, the pellets may be heated from room temperature to a maximum temperature over a period of about 12 hours and may be maintained at the maximum temperature for about 2 hours. Further, the maximum temperature of between about 1300° C. and 1800° C., for example, about 1400° C., 14500 C, 1500° C., 1515° C. 1550° C., 1600° C., 1615° C., 1650° C., 1700° C., or the like. Next, the pellet may be cooled back to room temperature for a cooling period of about 12 hours. Further, it should be understood that sintering the pellet having the rare-earth doped nanoparticles 110 forms the doped polycrystalline ceramic optical device 120 having a rare-earth element dopant 130, described above.

After sintering, the pellet may also be hot iso-statically pressed at a temperature of between about 1400° C. and about 1800° C., for example, about 1515° C., 1625° C. 1650° C., or the like. Further, the pellet having the rare-earth doped nanoparticles 110 may be placed under high pressure while heated, for example, for about the 4 hours at about 29 Kpsi. Moreover, during the hot iso-static pressing process, the pellet having the rare-earth doped nanoparticles 110 may be placed in argon or another noble gas. In some embodiments, the maximum temperature reached during the sintering process may be greater than the maximum temperature reached during the hot iso-static pressing process. After hot iso-statically pressing the pellet having the rare-earth doped nanoparticles 110, the pellet may be polished, for example, to a 0.5 µm diamond finish. After polishing, the pellet may be oxidized at 1100° C. in air for 2 hours then annealed. Annealing may remove any carbon that diffused into the pellet during hot iso-static pressing process. Such carbon contamination can be removed by annealing the pellet in air at about 1200° C. for about 12 hours. The annealing process may then be repeated, for example, for about 4 hours. It should be understood that sintering the pellet having the rare-earth doped nanoparticles 110 forms the doped polycrystalline ceramic optical device 120 having a rare-earth element dopant 130, described above.

Figure 3E:
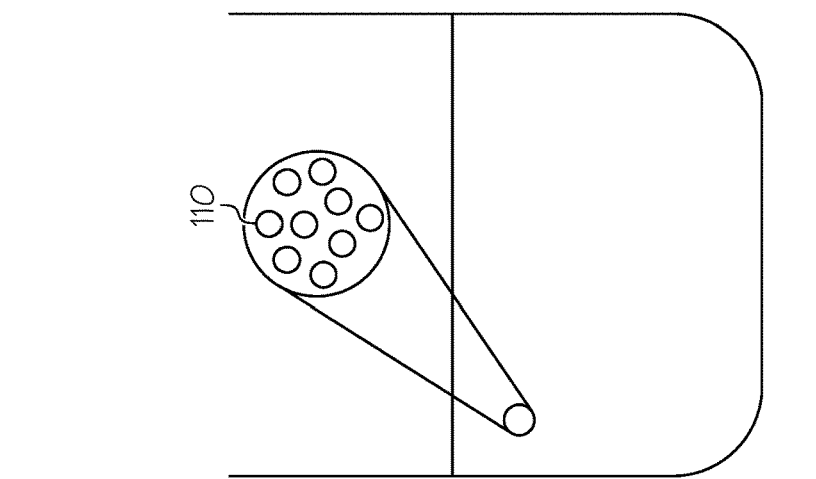
FIG. 3E is a schematic illustration of a plurality of rare-earth doped nanoparticles used to form the doped polycrystalline ceramic optical device of FIG. 1, according to one or more embodiments shown and described herein.
Figure 3D:
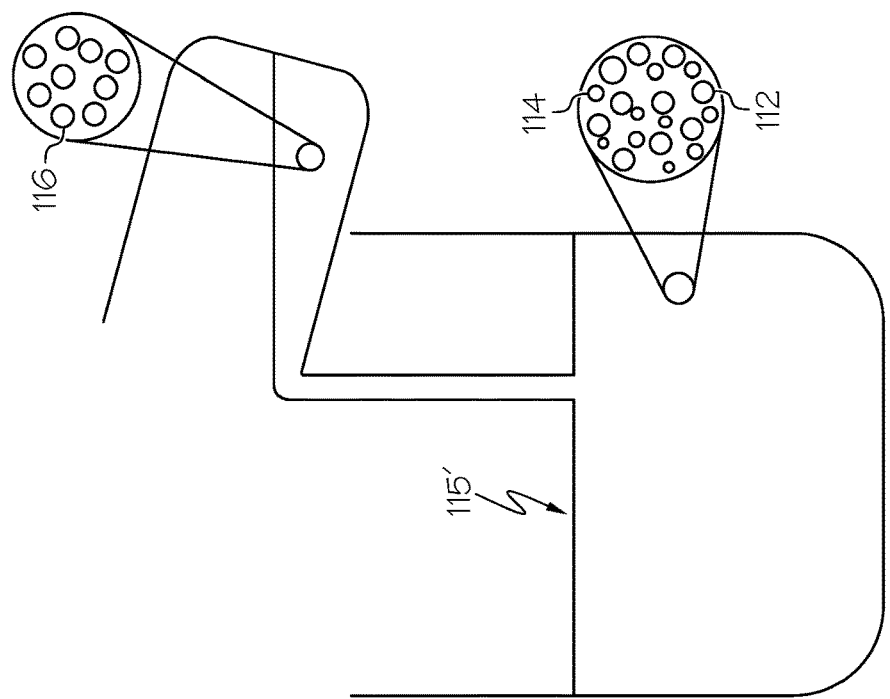
FIG. 3D is a schematic illustration the addition of organic precursor to a heated metal salt mixture used to form the doped polycrystalline ceramic optical device of FIG. 1, according to one or more embodiments shown and described herein.
Figure 3C:
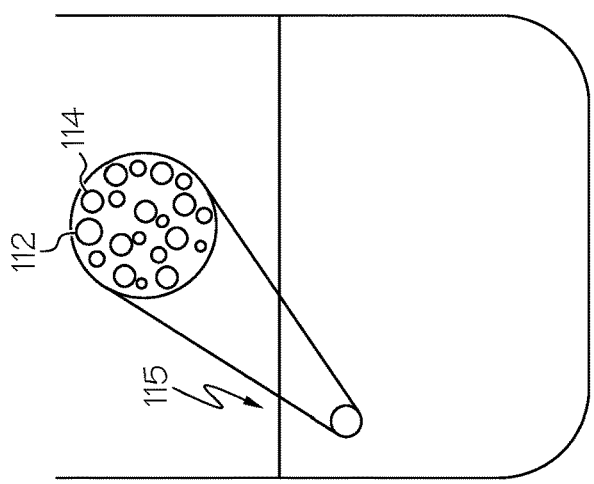
FIG. 3C is a schematic illustration of a metal salt mixture used to form the doped polycrystalline ceramic optical device of FIG. 1, according to one or more embodiments shown and described herein.

Referring now to FIGS. 3C-3E, another method of manufacturing the doped polycrystalline ceramic optical device 120 of FIG. 1 is contemplated. As depicted in FIG. 3A, the method first comprises mixing the plurality of transition metal complexes 112, the plurality of rare-earth metal complexes 114, and deionized water to form a metal salt solution 115. As one example, the metal salt solution 115 may include between about 40 g and about 80 g of the transition metal complexes 112, for example, about 50 g, 60 g, 65 g, 65.53 g, 70 g, or the like. The metal salt solution 115 may also include between about 0.01 g and about 0.5 g of the rare-earth metal complexes 114, for example, about 0.05 g, 0.1 g, 0.15 g, 0.2 g, 0.25 g, 0.35 g, or the like. Moreover, the metal salt solution 115 may include between about 2 L and about 6 L of deionized water, for example, about 3 L, 4 L, 4.32 L, 5 L, or the like. In one example, the metal salt solution 115 may comprise about 0.2-0.25 moles of metal salts (e.g., the plurality of transition metal complexes 112 and the plurality of rare-earth metal complexes 114) in about 4 L of deionized water).

Referring still to FIGS. 3C-3E, the method further comprises heating the metal salt solution 115 to form a heated metal salt solution 115'. For example, the metal salt solution 115 may be heated to a temperature of from about 70° C. to about 100° C., such as about 80° C., 90° C., 100° C., or the like. As one example, the heated metal salt solution 115' may be heated to a boil. Next, as depicted in FIG. 3D, the organic precursor 116 may be mixed with the heated metal salt solution 115', inducing formation of the rare-earth doped nanoparticles 110. In some embodiments, the temperature of the organic precursor 116 may be less than the temperature of the heated metal salt solution 115' when mixed with the heated metal salt solution 115', and in other embodiments, the organic precursor 116 may be the same temperature or a greater temperature than the heated metal salt solution 115'.

Further, preforming the heated metal salt solution 115' then mixing the organic precursor 116 with the heated metal salt solution 115' may induce formation of rare-earth doped nanoparticles 110 that have a smaller diameter than rare-earth doped nanoparticles 110 formed using the precursor mixture 111 described above with respect to FIGS. 3A and 3B. For example, the rare-earth doped nanoparticles 110 formed by mixing the organic precursor 116 and the heated metal salt solution 115' may comprise 200 nm or less, such as 100 nm or less, 50 nm or less, 40 nm or less, 30 nm or less, or the like. While not intending to be limited by theory, it is believed that mixing the organic precursor 116 and the heated metal salt solution 115' produces more rare-earth doped nuclei, thereby forming smaller rare-earth doped nanoparticles 110.

In operation, the thermal decomposition of the organic precursor 116, such as urea, may produce $OH^-$ and $CO_3^{2-}$, which react with the transition metals of the plurality of transition metal complexes 112 and the rare-earth metals of the plurality of rare-earth metal complexes 114 of the heated metal salt solution 115' to produce the plurality of rare-earth doped nanoparticles 110, for example, $Y_{1-x}Er_x(OH)CO_3 \cdot H_2O$ nanoparticles. Further, the $Y_{1-x}Er_x(OH)CO_3 \cdot H_2O$ nanoparticles may be filtered and collected then annealed at an annealing temperature of between about 500° C. and about 900° C., such as about 600° C., 700° C., 800° C., or the like, to convert the $Y_{1-x}Er_x(OH)CO_3 \cdot H_2O$ rare-earth doped nanoparticles 110 into $(Y_{1-x}Er_x)_2O_3$ rare-earth doped nanoparticles 110. Once annealed, the rare-earth doped nanoparticles 110 may comprise a crystalline structure. Moreover, the chemical yield of the rare-earth doped nanoparticles 110 may be between about 85% and about 98%, for example 88%, 90%, 92%, 95%, or the like.

Further, in the method of FIGS. 3C-3E, the amount of rare-earth element dopant in the plurality of rare-earth doped nanoparticles 110 may be altered by changing the ratio of transition metal complexes 112 and rare-earth metal complexes 114 in the metal salt solution 115. For example, increasing the relative amount of rare-earth metal complexes 114 in the metal salt solution 115 may increase the amount of rare-earth element dopant in the resultant plurality of rare-earth doped nanoparticles 110. The method depicted in FIGS. 3C-3E may further include milling the plurality of rare-earth doped nanoparticles 110 using a milling media to form a slurry, filtering the milling media from the slurry, and adding one or more binders to the slurry, as described above with respect to FIGS. 3A and 3B.

Referring still to FIGS. 3C-3E, the method of manufacturing the doped polycrystalline ceramic optical device 120 may next comprising sintering the plurality of rare-earth doped nanoparticles 110 using any of the sintering processes described above with respect to FIGS. 3A and 3B. In one example process, the plurality of rare-earth doped nanoparticles 110 may be pressed into a pellet of rare-earth doped nanoparticles 110, for example, using a steel die at from about 6 Klbs of force to about 10 Klbs of force, such as about 8 Klbs of force. Next, the pellet of rare-earth doped nanoparticles 110 may be isostatically pressed at room temperature, for example, using a latex iso-pressing sheath, at from about 20 Kpsi to about 30 Kpsi, for example, 25 Kpsi. The pellet of rare-earth doped nanoparticles 110 may then be sintered at a sintering temperature of 1300° C. or more, for a sintering period of from about 1.5 hours to about 2.5 hours, for example, about 2 hours. After sintering, the pellet of rare-earth doped nanoparticles 110 may then be hot isostatically pressed at a temperature of from about 1300° C. to about 1600° C. (e.g., 1500° C.) for a hot isostatic pressing period of from about 14 hours to about 18 hours (e.g., 16 hours), at a pressure of about 15 Kpsi to about 35 Kpsi (e.g., 29 Kpsi). The hot isostatic pressing step may occur in a graphite furnace in the presence of argon. During hot isostatically pressing, the pellet of rare-earth doped nanoparticles 110 may be positioned in $Y_2O_3$ powder (e.g., buried) to reduce carbon contaminations. In operation, the hot isostatic pressing may densify (e.g., increase the density) of the pellet of rare-earth doped nanoparticles 110. After formation, the doped polycrystalline ceramic optical device may be polished to a surface finish of about 0.5 μm Ra.

In one example manufacturing process, the pellet of rare-earth doped nanoparticles 110 may first be sintered at a sintering temperature of about 1550° C. then isostatically pressed at a temperature of about 1515° C. In a second example manufacturing process, the pellet of rare-earth doped nanoparticles 110 may first be sintered at a sintering temperature of about 1550° C. then isostatically pressed at a temperature of about 1515° C. In a third example manufacturing process, the pellet of rare-earth doped nanoparticles 110 may first be sintered at a sintering temperature of about 1550° C. then isostatically pressed at a temperature of about 1515° C. In each of the three example manufacturing processes above, the sintering pressure may about 29 Kpsi, the sintering period may be about 2 hours, and the hot isostatic pressing period may be about 16 hours. Further, in each of the three example processes, the hot isostatic pressing temperature may be less than the sintering process, which minimizes crystal grain growth during hot isostatic pressing.

Further, the resultant doped polycrystalline ceramic optical device 120 formed using the methods of manufacture of FIGS. 3C-3E may be configured to facilitate an axial optical transmission of a plurality of photons traversing the doped polycrystalline ceramic optical device 120 each comprising a wavelength of from about 1000 nm to about 2000 nm, such as about 1535 nm, 1550 nm, or the like, of from about 70% to about 82%, for example 75%, 77%, 80%, 81%, 81.5%, 81.7%, or the like. Further, a scattering angle of the plurality of photons may be about 2.5°. Individual crystals of the doped polycrystalline ceramic optical device 120 may comprise a grain size (e.g., largest dimension of each crystal) of from about 0.15 μm to about 2.5 μm, for example, about 0.2 μm, 0.4 μm, 0.6 μm, 0.8 μm, 1 μm, 1.2 μm, 1.4 μm, 1.6 μm, 1.8 μm, 2 μm, 2.2 μm, 2.4, μm, or the like. Further, an average grain area of the individual crystals of the doped polycrystalline ceramic optical device 120 may be from about 0.25 μm² to about 0.35 μm², for example, 0.26 μm², 0.27 μm², 0.28 μm², 0.29 μm², 0.3 μm², 0.31 μm², 0.32 μm², 0.33 μm², 0.34 μm², or the like. Further, the grain size may be tuned by varying the sintering temperature during the sintering process. For example, higher sintering temperatures may form crystals comprising larger grain areas. As one example, when the pellet of rare-earth doped nanoparticles 110 is sintered at a temperature of about 1550° C., the individual crystals of the doped polycrystalline ceramic optical device 120 may comprise a grain size of from about 0.7 μm to about 2.1 μm.

In operation, the sintering temperature used to form the doped polycrystalline ceramic optical device 120 is correlated with the size and density of scattering centers, such as residue pores, formed within the doped polycrystalline ceramic optical device 120. Lower sintering temperatures lower the size and density of the scattering centers, which cause scattering induced attenuation when photons traverse the doped polycrystalline ceramic optical device 120. Thus, reducing the size and density of scattering centers may reduce the attenuation rate of photons traversing the doped polycrystalline ceramic optical device 120. When a plurality of photons, such as storage photons, traverse the doped polycrystalline ceramic optical device 120, the scattering induced attenuation of the plurality of photons may be defined by a transmitted scattering coefficient μ, where $$\mu = 10 \frac{\log(T_t/T_a)}{L},$$

$T_t$ is the total optical transmission of the plurality of photon through the doped polycrystalline ceramic optical device 120, $T_a$ is axial optical transmission of the plurality of photons traversing the doped polycrystalline ceramic optical device 120, and L is the thickness of the doped polycrystalline ceramic optical device 120. The axial optical transmission $T_a$ of the plurality of photons traversing the doped polycrystalline ceramic optical device 120 is increased when scattering centers are reduced and as such, forming the doped polycrystalline ceramic optical device 120 using lower sintering temperatures may reduce the scattering induced attenuation and the overall attenuation rate of photons traversing the doped polycrystalline ceramic optical device 120

Moreover, a doped polycrystalline ceramic optical device 120 formed using smaller diameter rare-earth doped nanoparticles 110 may facilitate a lower attenuation rate than doped polycrystalline ceramic optical devices 120 formed using larger diameter rare-earth doped nanoparticles 110. For example, the doped polycrystalline ceramic optical device 120 formed using the methods of manufacture described with respect to FIGS. 3C-3E may comprise an attenuation rate of 5 dB/mm or less, 4 dB/mm or less, 3 dB/mm or less, 2 dB/mm or less, 1 dB/mm or less, or the like.

Referring now to FIG. 4, an optical system 200 comprising a quantum repeater system 201, one or more magnetic field generation units 240, and one or more pump lasers 280, is schematically depicted. The quantum repeater system 201 includes first and second doped polycrystalline ceramic optical devices 220a, 220b and repeater entanglement optics 210. Further, the first and second doped polycrystalline ceramic optical devices 220a, 220b may each comprise the doped polycrystalline ceramic optical device 120 described above with respect to the quantum memory system 100.

For example, the first and second doped polycrystalline ceramic optical device 220a, 220b each comprise a first end 226 and a second end 228 that may be opposite the first end 226. Further, the first and second doped polycrystalline ceramic optical devices 220a, 220b are doped with a rare-earth element dopant 230 that is uniformly distributed within a crystal lattice 222a, 222b of each of first and second doped polycrystalline ceramic optical device 220a, 220b. The rare-earth element dopant 230a, 230b may comprise any of the rare-earth element dopants 130 described above. Further, the first and second doped polycrystalline ceramic optical devices 220a, 220b may comprise doped polycrystalline ceramic optical waveguides, as described above. Moreover, the quantum memory system 100 may further comprise a cooling system 290 thermally coupled to each doped polycrystalline ceramic optical device 220a, 220b. The cooling system 290 may comprise any of the cooling systems 190 described above.

The one or more magnetic field generation units 250 may comprise the magnetic field generation units 140 described above. Further, the first and second doped polycrystalline ceramic optical devices 220a, 220b are positioned within a magnetic field of the one or more magnetic field generation units 250 when the one or more magnetic field generation units 250 generate magnetic fields. Further, while a single magnetic field generation unit 250 is depicted in FIG. 3, it should be understood that any number of magnetic field generation units 250 are contemplated. For example, the first and second doped polycrystalline ceramic optical device 220a, 220b may be positioned within the magnetic fields of different magnetic field generation units 250.

Referring still to FIG. 4, the optical system 200 further comprises one or more storage photon generators 270a, 270b optically coupled to each doped polycrystalline ceramic optical devices 220a, 220b, for example, optically coupled to the first end 226a, 226b of each doped polycrystalline ceramic optical device 220a, 220b. For example, the first storage photon generator 270a may be optically coupled to the first end 226a of the first doped polycrystalline ceramic optical device 220a and the second storage photon generators 270b may be optically coupled to the first end 226b of the second doped polycrystalline ceramic optical device 220b. The one or more storage photon generators 270a, 270b may comprise any of the storage photon generators 170 described above.

Further, the one or more pump lasers 280 are optically coupled to the doped polycrystalline ceramic optical devices 220a, 220b. For example, the one or more pump lasers 280 may comprise a first pump laser 280a and a second pump laser 280b each optically coupled to the first doped polycrystalline ceramic optical device 220a as well as a third pump laser 280c and a fourth pump laser 280d each optically coupled to the second doped polycrystalline ceramic optical device 220b. For example, as depicted in FIG. 3, the first pump laser 280a may be optically coupled to the first end 226a of the first doped polycrystalline ceramic optical device 220a, the second pump laser 280b may be optically coupled to the second end 228a of the first doped polycrystalline ceramic optical device 220a, the third pump laser 280c may be optically coupled to the first end 226b of the second doped polycrystalline ceramic optical device 220b, and the fourth pump laser 280d may be optically coupled to the second end 228b of the second doped polycrystalline ceramic optical device 220b. Moreover, the one or more pump lasers 280 may comprise any of the pump lasers 180 described above.

Further, the one or more storage photon generators 270a, 270b, the one or more pump lasers 280a, 280b and/or the doped polycrystalline ceramic optical devices 220a, 220b may be coupled to one or more alignment mechanisms 242 to optically align the one or more storage photon generators 270a, 270b and the one or more pump lasers 280 with the doped polycrystalline ceramic optical devices 220a, 220b. Further, the one or more alignment mechanisms 242 may comprise any of the alignment mechanisms 142 described above. Moreover, the doped polycrystalline ceramic optical devices 220a, 220b doped with the rare-earth element dopants 230a, 230b are configured to absorb and release storage photons as described above with respect to FIGS. 1 and 2.

The optical system 200 may further comprise first and second WDMs 260a, 260b, optically coupled to the first and second doped polycrystalline ceramic optical devices 220a, 220b, for example, the respective first ends 226a, 226b of the first and second doped polycrystalline ceramic optical devices 220a, 220b. The WDMs 260a, 260b may each comprise the WDM 160 described above. Further, WDMs 260a, 260b may be optically coupled to both storage photon pathways 262a, 262b and pump pulse pathways 264a, 264b for example, the WDMs 260a, 260b may be positioned between the first ends 226a, 226b of the first and second doped polycrystalline ceramic optical devices 220a, 220b and both the storage photon pathways 262a, 262b and the pump pulse pathways 264a, 264b.

The storage photon pathways 262a, 262b may extend between the WDMs 260a, 260b and the repeater entanglement optics 210. For example, the first storage photon pathway 262a may extend between and optically couple the first WDM 260a and a first entangling pathway 212a of the repeater entanglement optics 210. Further, the second storage photon pathway 262b may extend between and optically couple the second WDM 260b and a second entangling pathway 212b of the repeater entanglement optics 210. Moreover, the pump pulse pathways 264a, 264b may extend between the WDMs 260a, 260b and pump pulse receivers 268a, 268b, which may comprise the pump pulse receiver 168, described above.

As depicted in FIG. 4, the optical system 200 may further comprise first and second optical circulators 250a, 250b, positioned adjacent and optically coupled to the respective first and second doped polycrystalline ceramic optical devices 220a, 220b, for example, to the respective first ends 226a, 226b of the first and second doped polycrystalline ceramic optical devices 220a, 220b, as depicted in FIG. 4. The first and second optical circulators 250a, 250b may comprise any of the optical circulators 150 described above. For example, the first and second optical circulators 250a, 250b may each comprise three or more optical ports, for example, a first optical port 252a, 252b, a second optical port 254a, 254b, and a third optical port 256a, 256b.

The first and second optical circulators 250a, 250b are positioned between the respective first and second storage photon generators 270a and first and second doped polycrystalline ceramic optical devices 220a, 220b. For example, the first optical ports 252a, 252b of the first and second optical circulators 250a, 250b are optically coupled to the respective first and second storage photon generators 270a, 270b and the second optical ports 254a, 254b of the first and second optical circulators 250a, 250b are optically coupled to the respective first ends 226a, 226b of the first and second doped polycrystalline ceramic optical devices 220a, 220b.

Further, the first optical circulator 250a may also be positioned between at least one of the pump lasers 280 (e.g., the first pump laser 280a) and the first doped polycrystalline ceramic optical device 220a, for example, the first end 226a of the first doped polycrystalline ceramic optical device 220a such that the first optical port 252a of the first optical circulator 250a is optically coupled to at least one of the one or more pump lasers 280 (e.g., the first pump laser 280a) and the second optical port 254a of the first optical circulator 250a is optically coupled to the first end 226a of the first doped polycrystalline ceramic optical device 220a. For example, as depicted in FIG. 4, the first storage photon generator 270a and the first pump laser 280a are each optically coupled to the first optical port 252a of the first optical circulator 250a such that storage photons output by the first storage photon generator 270a and the pump pulse output by the first pump laser 180a enter the first optical port 252a of the first optical circulator 250a and exit the second optical port 254a towards the first end 226a of the first doped polycrystalline ceramic optical device 220a.

Moreover, the second optical circulator 250b may also be positioned between at least one of the pump lasers 280 (e.g., the third pump laser 280c) and the second doped polycrystalline ceramic optical device 220b, for example, the first end 226b of the second doped polycrystalline ceramic optical device 220b such that the first optical port 252b of the second optical circulator 250b is optically coupled to at least one of the one or more pump lasers 280 (e.g., the third pump laser 280c) and the second optical port 254b of the second optical circulator 250b is optically coupled to the first end 226b of the second doped polycrystalline ceramic optical device 220b. For example, as depicted in FIG. 4, the second storage photon generator 270b and the third pump laser 280c are each optically coupled to the first optical port 252b of the second optical circulator 250b such that storage photons output by the second storage photon generator 270b and the pump pulse output by the third pump laser 280c enter the first optical port 252b of the second optical circulator 250b and exit the second optical port 254b towards the first end 226b of the second doped polycrystalline ceramic optical device 220b.

The first and second optical circulators 250a, 250b may also be positioned between the respective first and second WDMs 260a, 260b and the first and second doped polycrystalline ceramic optical devices 220a, 220b, for example, the respective first ends 226a, 226b of the first and second doped polycrystalline ceramic optical devices 220a, 220b. Further, the third optical port 256a, 256b of the first and second optical circulators 250a, 250b are optically coupled to the respective first and second WDMs 260a, 260b such that the first and second WDMs 260a, 260b receive the storage photon after the storage photon exits the first end 226a, 226b of the first and second doped polycrystalline ceramic optical devices 220a, 220b and may receive some or all of the pump pulses output by the first, second, third, and fourth pump lasers 280a, 280b, 280c, 280d.

Referring still to FIG. 4, the repeater entanglement optics 210 of the quantum repeater system 201 each comprise two entangling pathways 212a, 212b optically coupled to and the second ends 228a, 228b of each doped polycrystalline ceramic optical devices 220a, 220b, for example, using the first and second WDMs 260a, 260b and the first and second storage photon pathways 262a, 262b. The two entangling pathways 212a, 212b may also be optically coupled to two entanglement detectors 214a, 214b. The repeater entanglement optics 210 further comprise a beamsplitter 216 positioned such that each entangling pathway 212a, 212b traverses the beamsplitter 216. Further the two entanglement detectors 214a, 214b may each comprise one or more single-photon detectors, e.g., superconducting nanowire single-photon detectors, low noise photodiodes, or the like. In operation, the repeater entanglement optics 210 are structurally configured to entangle pairs of storage photons when storage photons output by each doped polycrystalline ceramic optical device 220a, 220b simultaneously traverse the beamsplitter 216.

In operation, each doped polycrystalline ceramic optical device 220a, 220b doped with the rare-earth element dopant 230a, 230b is structurally and compositionally configured to absorb and store individual storage photons emitted by the storage photon generators 270a, 270b. For example, when a shaped spectral structure has been generated in the rare-earth element dopant 230 of each doped polycrystalline ceramic optical device 220a, 220b and the storage photons are traversing each doped polycrystalline ceramic optical device 220a, 220b, each storage photons may each transfer a superposition of the shaped spectral structure of the rare-earth element dopants 230a, 230b from the first split ground state $G_1$ to the excited energy state $E_1$, as schematically shown in FIG. 2, to absorb each respective storage photon in each respective doped polycrystalline ceramic optical device 220a, 220b. Further, upon receipt of a first pump pulse output by the first and second pump lasers 280a, 280b, each first pump pulse may transfer the superposition of the shaped spectral structure of the rare-earth element dopant 230a, 230b of each respective doped polycrystalline ceramic optical device 220a, 220b from the excited energy state $E_1$ into the second split ground state $G_2$, to store each storage photon.

Each doped polycrystalline ceramic optical device 220a, 220b doped with the rare-earth element dopant 230a, 230b is also structurally and compositionally configured to release, on demand, the storage photon stored within each doped polycrystalline ceramic optical device 220a, 220b. For example, upon receipt of a second pump pulse output by the third and fourth pump lasers 280a, 280b, the superposition of the shaped spectral structure of the rare-earth element dopants 230a, 230b is transferred from the second split ground state $G_2$ back to the excited energy state $E_1$. Once in the excited energy state $E_1$, the shaped spectral structure of the rare-earth element dopants 230a, 230b will automatically release the storage photons after a delay period, such that the storage photons exit each doped polycrystalline ceramic optical device 220a, 220b, for example, the first ends 226a, 226b of each doped polycrystalline ceramic optical device 220a, 220b.

Further, if the third and fourth pump lasers 280c, 280d emit second pump pulses that are simultaneously received by the first and second doped polycrystalline ceramic optical devices 220a, 220b (e.g., by emitting the second pump pulses simultaneously), the first and second doped polycrystalline ceramic optical devices 220a, 220b will simultaneously release the storage photons (after the delay period), allowing the storage photons to simultaneously traverse the beamsplitter 216 of the repeater entanglement optics 210, entangling the storage photons. Moreover, because doped polycrystalline ceramic optical devices 220a, 220b comprise long photon storage lifetimes, one doped polycrystalline ceramic optical device 220a/220b may absorb and store a first storage photon before the other doped polycrystalline ceramic optical device 220a/220b absorbs and stores a second storage photon, allowing storage photons that are not simultaneously received by the doped polycrystalline ceramic optical device 220a, 220b to be simultaneously released by the doped polycrystalline ceramic optical device 220a, 220b and entangled by the repeater entanglement optics 210.

Figure 5:
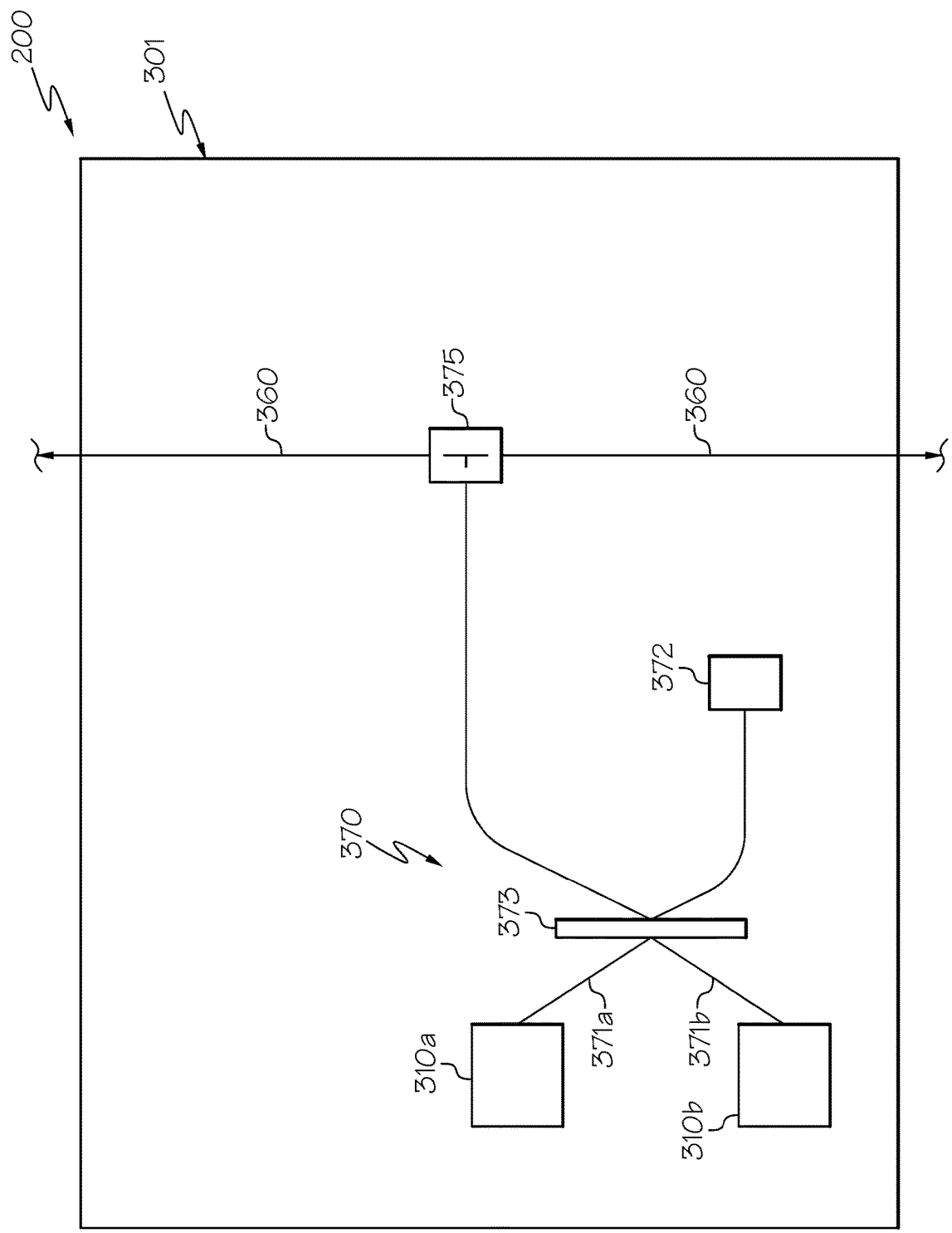
FIG. 5 schematically depicts an example optical system comprising multiple quantum repeater systems, according to one or more embodiments shown and described herein.

Referring now to FIG. 5, the optical system 200 may be arranged as an entangled photon generator 301 structurally configured to generate four or more entangled photons, for example, two or more entangled pairs of photons. Further, the optical system 200 may be positioned in one or more photon entanglement chains of a quantum key generation system, for example, the quantum key generation systems described in U.S. patent application Ser. No. 14/680,522. As depicted in FIG. 5, the optical system 200 arranged as the entangled photon generator 301 comprises a first quantum repeater system 310a, a second quantum repeater system 310b, a repeater coupling entanglement optics 370, a pathway splitter 375, and an entanglement detector 372. Further, the first and second quantum repeater system 310a, 310b may comprise any of the quantum repeater systems 201 described above with respect to FIG. 4.

In some embodiments, the first and second quantum repeater systems 310a, 310b may comprise entanglement optics (e.g., the repeater entanglement optics 210 of FIG. 4, above) that do not include two entanglement detectors 214a, 214b such that each entangling pathway 212a, 212b may be optically coupled to the repeater coupling entanglement optics 370 of the entangled photon generator 301. In other embodiments, the first and second quantum repeater systems 310a, 310b may include the entanglement detectors 214a, 214b and the repeater coupling entanglement optics 370 of the entangled photon generator 301 may be optically coupled to each entangling pathway 212a, 212b, for example, when the entanglement detectors 214a, 214b are structurally configured to detect the storage photons without the storage photons terminating therein.

Referring still to FIG. 5, the repeater coupling entanglement optics 370 may comprise a first entangling pathway 371a optically coupled to and extending between the first quantum repeater system 310a and the entanglement detector 372 and a second entangling pathway 371b optically coupled to and extending between the second quantum repeater system 310b and the pathway splitter 375. Additional entangling pathways 371 are contemplated in embodiments comprising additional quantum repeater systems 310. In some embodiments, the repeater coupling entanglement optics 370 further comprise a beamsplitter 373 positioned such that each entangling pathway 371a, 371b traverses the beamsplitter 373. In operation, the repeater coupling entanglement optics 370 are structurally configured to entangle multiple photons (e.g., storage photons) when the multiple photons simultaneously traverse the beamsplitter 373. For example, when each entangled pair of photons output by the first and second quantum repeater systems 310a, 310b simultaneously traverse the beamsplitter 373, all four photons are entangled with each other.

Further, the repeater coupling entanglement optics 370 are configured such that some or all of the entangled photons output by each of the first and second quantum repeater systems 310a, 310b are received by the entanglement detector 372 and/or the pathway splitter 375. For example, when a first entangled pair of photons are output by the first quantum repeater system 310a and a second entangled pair of photons are output by the second quantum repeater system 310b and these two entangled pairs of photons are entangled with each other at the beamsplitter 373, there is a probability that one of at least three outcomes occur, which are mathematically described by the wave function:

$$\Psi\rangle_{AA'} = -\left[\frac{1}{2}|2,2\rangle + \sqrt{\frac{3}{8}}\left(|4,0\rangle + |0,4\rangle\right)\right].$$

In a first outcome, both the entanglement detector 372 and the pathway splitter 375 receive two of the four entangled photons, mathematically described by the ket $|2,2\rangle$ in the above wave function. In a second outcome, the entanglement detector 372 receives the four entangled photons, mathematically described by one of the kets $|4,0\rangle$ or $|4,0\rangle$ in the above wave function. In a third outcome, the pathway splitter 375 receives the four entangled photons, mathematically described by one of the kets $|4,0\rangle$ or $|4,0\rangle$ in the above wave function. In some embodiments, the probability that the pathway splitter 375 receives the four entangled photons is about ⅜. Further, embodiments comprising additional parametric down conversion generators are contemplated such that additional entangled pairs of photons (e.g., N entangled photons) may be entangled by the repeater coupling entanglement optics 370. In an embodiment comprising N entangled photons, the probability that the N entangled photons are received by the entanglement detector 372, the pathway splitter 375, or a combination of both is mathematically described by the generalized ket:

$$|N,N\rangle_{out} = \frac{i^N}{N!2^N} \sum_{p=0}^{N} \binom{N}{p} \sqrt{(2p)!(2N-2p)!} \left| 2p, 2N-2p \right\rangle.$$

Further, in some embodiments, at least a portion of both the first and second entangling pathways 371a, 371b may comprise multicore optical fibers. For example, a portion of the first entangling pathway 371a that extends between the beamsplitter 373 and the pathway splitter 375 and a portion of the second entangling pathway 371b that extends between the beamsplitter 373 and the pathway splitter 375 may each comprise multicore optical fiber. In some embodiments, at least a portion of both the first and second entangling pathways 371a, 371b may comprise one or more optical waveguides.

In some embodiments, the pathway splitter 375 is structurally configured to direct entangled pairs of photons into optical fiber links 360 optically coupled to the pathway splitter 375. For example, when the pathway splitter 375 receives four entangled photons, the pathway splitter 375 may direct two of the four entangled photons into one optical fiber link 360 and the pathway splitter 375 may direct two of the four entangled photons into another optical fiber link 360. The optical fiber links 360 may comprise any optical fiber, for example, a glass optical fiber comprising a single core or comprising multiple cores. Further, in embodiments when the entangled photon generator 301 is configured to generate more than four entangled photons, the pathway splitter 375 may direct a first subset (e.g., about half) of the entangled photons into one optical fiber link 360 (e.g., a first optical fiber link) and the pathway splitter 375 may also direct a second subset (e.g., about half) of the entangled photons into another optical fiber link 360 (e.g., a second optical fiber link). In some embodiments, the pathway splitter 375 may comprise a fused biconical taper splitter, a planar lightwave circuit splitter, or the like.

In some embodiments, the entanglement detector 372 is structurally configured to measure the number of photons received by the entanglement detector 372, which also provides information regarding the number of photons received by the pathway splitter 375. For example, if two entangled photons are output by each of the first and second quantum repeater systems 310a, 310b and zero entangled photons are received by the entanglement detector 372, than all four entangled photons are received by the pathway splitter 375. In some embodiments, the entanglement detector 372 may comprise a multi-photon detector. In alternative embodiments, the entanglement detector 372 may comprise a single-photon detector, e.g., a superconducting nanowire single-photon detector, a low noise photodiode, or the like.

It is noted that recitations herein of a component of the present disclosure being "configured" in a particular way, to embody a particular property, or to function in a particular manner, are structural recitations, as opposed to recitations of intended use. More specifically, the references herein to the manner in which a component is "configured" denotes an existing physical condition of the component and, as such, is to be taken as a definite recitation of the structural characteristics of the component.

For the purposes of describing and defining the present invention it is noted that the term "about" is utilized herein to represent the inherent degree of uncertainty that may be attributed to any quantitative comparison, value, measurement, or other representation. The term "about" is also utilized herein to represent the degree by which a quantitative representation may vary from a stated reference without resulting in a change in the basic function of the subject matter at issue.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Further, it will be apparent that modifications and variations are possible without departing from the scope of the present disclosure, including, but not limited to, embodiments defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising".

What is claimed is:

1. A quantum memory system comprising at least one doped polycrystalline ceramic optical device; each doped polycrystalline ceramic optical device is doped with a rare-earth element dopant that is uniformly distributed within a crystal lattice of the doped polycrystalline ceramic optical device such that at least 50% of the rare-earth element dopant is doped into grains of the crystal lattice at locations apart from the grain boundaries of the crystal lattice and the rare-earth element dopant comprises about 0.025% to about 1.75% of a total molecular weight of the doped polycrystalline ceramic optical device, and configured such that a plurality of storage photons traversing the doped polycrystalline ceramic optical device attenuate at an attenuation rate of about 1 dB/mm or less.

2. The quantum memory system of claim 1, wherein the at least one doped polycrystalline ceramic optical device is structured such that an entangled storage photon emitted from a storage photon generator may traverse the doped polycrystalline ceramic optical device.

3. The quantum memory system of claim 1, wherein at least 75% of the rare-earth element dopant is doped into grains of the crystal lattice at locations apart from the grain boundaries of the crystal lattice.

4. A quantum memory system comprising at least one doped polycrystalline ceramic optical device; each doped polycrystalline ceramic optical device is doped with a rare-earth element dopant that is uniformly distributed within a crystal lattice of the doped polycrystalline ceramic optical device and configured such that a plurality of storage photons traversing the doped polycrystalline ceramic optical device attenuate at an attenuation rate of about 1 dB/mm or less wherein:

(i) the rare-earth element dopant doped into the doped polycrystalline ceramic optical device is configured to absorb about 50% or more of a plurality of storage photons traversing the doped polycrystalline ceramic optical device; and/or (ii) the rare-earth element dopant doped into the doped polycrystalline ceramic optical device is configured to store a storage photon for a photon storage lifetime comprising between about 500 ns and about 1 ms.

5. A quantum memory system of claim 4, wherein the polycrystalline ceramic optical device comprises a phonon energy of between about 100 $cm^{-1}$ and about 800 $cm^{-1}$.

6. A quantum memory system of claim 4, wherein the polycrystalline ceramic optical device comprises a phonon energy of between about 200 $cm^{-1}$ and 700 $cm^{-1}$.

7. A quantum memory system of claim 4, wherein the rare-earth element dopant comprises: (i) erbium, thulium, praseodymium, or a combination thereof; and/or (ii) a non-Kramer's rare-earth ion.

8. The quantum memory system of claim 4, wherein the inhomogeneous linewidth of the doped polycrystalline ceramic optical device doped with the rare-earth element dopant is between about 1 nm and about 25 nm.

9. The quantum memory system of claim 8, wherein the inhomogeneous linewidth of the doped polycrystalline ceramic optical device is between about 5 nm and about 15 nm.

10. The quantum memory system of claim 4, wherein the homogeneous linewidth of the doped polycrystalline ceramic optical device doped with the rare-earth element dopant is 7.5 MHz or less.

11. The quantum memory system of claim 4, comprising a plurality of rare-earth doped nanoparticles.

12. The quantum memory system of claim 11, wherein rare-earth doped nanoparticles comprise between about 0.25% rare-earth element dopant and about 0.97% rare-earth element dopant.

* * * * *

UNITED STATES PATENT AND TRADEMARK OFFICE
CERTIFICATE OF CORRECTION

| | | |
|---|---|---|
| PATENT NO. | : 11,715,521 B2 | Page 1 of 1 |
| APPLICATION NO. | : 17/741591 | |
| DATED | : August 1, 2023 | |
| INVENTOR(S) | : Jason Allen Brown et al. | |

It is certified that error appears in the above-identified patent and that said Letters Patent is hereby corrected as shown below:

On the Title Page

On the page 2, in Column 2, item (56) under "Other Publications", Line 49, delete "Homegenous" and insert -- Homogeneous --.

In the Claims

In Column 28, Line 67, in Claim 4, after "less" insert -- , --.

Signed and Sealed this
Eighth Day of October, 2024

Katherine Kelly Vidal
*Director of the United States Patent and Trademark Office*